United States Patent
Arteaga Muller et al.

(10) Patent No.: US 11,205,573 B2
(45) Date of Patent: Dec. 21, 2021

(54) GE-CONTAINING CO-FILM FORMING MATERIAL, GE-CONTAINING CO FILM AND FILM FORMING METHOD THEREOF

(71) Applicant: L'Air Liquide, Société Anonyme pour l'Etude et l'Exploitation des Procédés Georges Claude, Paris (FR)

(72) Inventors: Rocio Alejandra Arteaga Muller, Yokosuka (JP); Nicolas Blasco, Paris (FR); Jean-Marc Girard, Paris (FR); Changhee Ko, Yokosuka (JP); Antonio Sanchez, Tokyo (JP); Raphael Rochat, Yokosuka (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 48 days.

(21) Appl. No.: 16/637,320

(22) PCT Filed: Aug. 2, 2018

(86) PCT No.: PCT/EP2018/071036
§ 371 (c)(1),
(2) Date: Feb. 7, 2020

(87) PCT Pub. No.: WO2019/030117
PCT Pub. Date: Feb. 14, 2019

(65) Prior Publication Data
US 2020/0234960 A1    Jul. 23, 2020

(30) Foreign Application Priority Data

Aug. 9, 2017 (JP) .............................. JP2017-154202
Jun. 18, 2018 (JP) ................................. 2018-115195

(51) Int. Cl.
*H01L 21/44* (2006.01)
*H01L 21/285* (2006.01)
(Continued)

(52) U.S. Cl.
CPC ........ *H01L 21/28556* (2013.01); *C23C 16/16* (2013.01); *C23C 16/45536* (2013.01);
(Continued)

(58) Field of Classification Search
CPC ......... H01L 21/28556; H01L 23/53238; H01L 29/45; H01L 29/785; C23C 16/16; C23C 16/45536; C23C 16/45553; C23C 16/50
(Continued)

(56) References Cited

U.S. PATENT DOCUMENTS 4,356,332 A    10/1982    Knifton
4,565,896 A *  1/1986    Knifton ................. C07C 29/156
                                                                568/678

FOREIGN PATENT DOCUMENTS

JP          2016 513086       5/2016
WO       WO 2014 118748     8/2014
WO       WO 2016 172792    11/2016

OTHER PUBLICATIONS

Brauer, D.J. et al., Preparation and properties of $Ge(CF_3)_3$ adducts of transition-metal carbonyls: x-ray structure of $(CF_3)_3GeMn(CO)_5$, Organometallics 1983, 2, 263-267.
(Continued)

*Primary Examiner* — Brook Kebede
(74) *Attorney, Agent, or Firm* — Allen E. White

(57) ABSTRACT

To provide a film forming material and a film forming process for forming, at a lower temperature, a Ge-containing Co film including a desired amount of Ge. A film forming material for forming a Ge-containing Co film according to the invention is represented by either formula (1) or formula
(Continued)

(2) below R¹R²R³Ge—Co(CO)₄ (1) (where $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group) Co(CO)₄R⁴R⁵Ge—Co(CO)₄ (2) (where $R^4$ and $R^5$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

22 Claims, 14 Drawing Sheets

(51) Int. Cl.
| | |
|---|---|
| *C23C 16/455* | (2006.01) |
| *C23C 16/50* | (2006.01) |
| *H01L 29/78* | (2006.01) |
| *H01L 23/532* | (2006.01) |
| *H01L 29/45* | (2006.01) |
| *C23C 16/16* | (2006.01) |

(52) U.S. Cl.
CPC ........ *C23C 16/45553* (2013.01); *C23C 16/50* (2013.01); *H01L 23/53238* (2013.01); *H01L 29/45* (2013.01); *H01L 29/785* (2013.01)

(58) Field of Classification Search
USPC ........................................................ 438/680
See application file for complete search history.

(56) References Cited

OTHER PUBLICATIONS

Castel, A. et al., Reactivity of halogermylenes with various transition-metal complexes. The first germylenes with germanium-transition-metal bonds, Organometallics, vol. 2, No. 11, Nov. 1983, 1498-1502.
Dalton, J. et al., Spectroscopic studies on organometallic compounds. Part XII. Infrared spectra of tetracarbonylcobalt complexes in the carbonyl stretching region, Journals of the Chemical Society (A), 1968, 1199-1202.
Domrachev, G.A. et al., Thermal decomposition of tetracarbonyl(triethylgermyl)cobalt, Izvestiya Akademii Nauk SSSR, Seriya Khimicheskaya, Apr. 8, 1997, No. 12, 2804-2806.
Ferri, F.A. et al., The composition, structure and optical properties of weakly magnetic co-containing amorphous Si and Ge films, Materials Chemistry and Physics, 134 (2012), 153-157.
Gerlach, R.F. et al., Transition metal carbonyl derivatives of the germanes. Part XI. mono-, di-, and tri-(cobaltcarbonyl)-substituted methylgermanes, Journal of Organometallic Chemistry, 1979, 182, 285-298.
Patmore, D.J. et al., Organometallic compounds with metal-metal bonds. II. The insertion of tin(II) and germanium(II) halides into metal-metal bonds, Inorganic Chemistry, Aug. 1966, vol. 5, No. 8, 1405-1407.
Patmore, D.J. et al., Organometallic compounds with metal-metal bonds. VII. Preparation and a study of the infrared spectra of mono- and bis(tetracarbonylcobalt derivatives of germanium and tin, Inorganic Chemistry, May 1967, vol. 6, No. 5, 981-988.
International Search Report and Written Opinion for corresponding PCT/EP2018/071036, dated Oct. 18, 2018.

\* cited by examiner

GE-CONTAINING CO-FILM FORMING MATERIAL, GE-CONTAINING CO FILM AND FILM FORMING METHOD THEREOF

CROSS REFERENCE TO RELATED APPLICATIONS

This application is a 371 of International PCT Application PCT/EP2018/071036, filed Aug. 2, 2018, which claims priority to Japanese Patent Application Nos. 2018-115195, filed Jun. 18, 2018, and JP 2017-154202, filed Aug. 9, 2017, the entire contents of which are incorporated herein by reference.

BACKGROUND

The present invention relates to a Ge-containing Co-film forming material, a Ge-containing Co film, and a method for forming a Ge-containing Co film using the Ge-containing Co-film forming material.

Metal silicide films are widely used for contact materials, gate electrodes, wiring materials, and diffusion barrier layers in the field of microelectronics because such films have low resistance, thermal stability, and high affinity for other materials.

However, as a next-generation channel material, it is expected to use Ge, which has high mobility instead, of Si which is currently widely used. When Ge is used as a channel material, it can be anticipated that a metal germanide film (for example, a cobalt germanide film) will be used as a contact material instead of a conventionally used metal silicide film (for example, a cobalt silicide film).

On one hand, in the wiring process, a Si-containing cobalt film is generally used as a diffusion barrier layer for copper wiring. On the other hand, due to high adhesiveness thereof, a Ge-containing Co film has attracted attention as a next-generation diffusion barrier layer.

A method for forming a Ge-containing Co film is known in which after forming the Co film and the Ge film, respectively, or after forming a Co film on a Ge substrate, annealing is performed to obtain a Ge-containing Co film (for example, see NPL 1).

Also disclosed is a method for obtaining a Ge-containing Co film by a CVD method or an ALD method by using a precursor containing Co and Ge (see, for example, PTL 1).

PATENT LITERATURE

WO 2016/172792
JP-T-2016-513086

Non-Patent Literature

NPL 1: F. A. Fern, M. A. Pereira-da-Silvaa, "The composition, structure and optical properties of weakly magnetic Co-containing amorphous Si and Ge films," *Materials Chemistry and Physics*, 134 (2012) 153-157

NPL 2: G. A. Domrachev, 4 others, "Thermal Decomposition of Tetracarbonyl (Triethylgermyl) Cobalt," *Izvestiya Akademii Nauk SSSR, Seriya Khimicheskaya*, Apr. 8, 1997, No. 12, p. 2804-2806

NPL 3: D. J. Patmore, 1 other, "Organometallic Compounds with Metal-Metal Bonds. VII", *Inorganic Chemistry*, May 1967, Vol. 6, No. 5, p. 981-988

NPL 4: Robert F. Gerlach, 2 others, "Transition Metalcarbonyl Derivatives of the Germanes Part XI," *Journal of Organometallic Chemistry*, 1979, 182, p. 285-298

NPL 5: David J. Brauer, 1 other, "Preparation and Properties of Ge(CF3)3 Adducts of Transition-Metal Carbonyls," *Organometallics*, 1983, Vol. 2, No. 2, p. 263-267

In the method for obtaining a Ge-containing Co film by annealing, the semiconductor film is greatly damaged due to annealing performed at a high temperature. Meanwhile, a problem arising, when a Ge-containing Co film is formed by a CVD method or an ALD method using a precursor including Co and Ge, is that a resistance value increases, that the stoichiometric ratio between Co and Ge is difficult to control, and that the amount of impurities in the film increases.

When a film is formed at a low temperature of about 200° C. by using a precursor including Co and Si (for example, $Et_3Si$—$Co(CO)_4$), a Co film is obtained and the Si amount in the Co film is very small (PTL 1 and PTL 2). From this result, it is expected that a Co film can be obtained also when a film is formed using a precursor including Co and Ge, and it is conceivable that a Co film including a desired amount of Ge will be difficult to obtain.

As a compound including Co and Ge, for example, a CoGe compound including an alkyl group (NPL 2) and CoGe compounds including a halogeno group (NPL 3, NPL 4 and NPL 5) are known. However, there is no known example of using these compounds to form a Ge-containing Co film.

It follows from the above that a film forming process for forming, at a low temperature, a Ge-containing Co film including a desired amount of Ge is desired.

Notation and Nomenclature

Notation and nomenclature, some abbreviations, symbols and terms are used throughout the following specification and claims.

As used in the present specification, the term "alkyl group" refers to a saturated or unsaturated functional group containing only carbon and hydrogen atoms. Furthermore, the term "alkyl group" refers to a straight chain, branched or cyclic alkyl group. Examples of the straight chain alkyl group include, but are not limited to, a methyl group, an ethyl group, a propyl group, a butyl group and the like. Examples of the branched alkyl group include, but are not limited to, t-butyl. Examples of the cyclic alkyl group include, but are not limited to, a cyclopropyl group; a cyclopentyl group, a cyclohexyl group, and the like. Examples of the crosslinked alkyl group include, but are not limited to, a vinyl group coordinating to a single metal atom, and the like.

As used in the present specification, the abbreviation "Me" refers to a methyl group, the abbreviation "Et" refers to an ethyl group, the abbreviation "Pr" refers to any propyl group (that is, normal propyl or isopropyl), the abbreviation "$^i$Pr" refers to an isopropyl group, the abbreviation "Bu" refers to any butyl group (normal butyl, isobutyl, tertiary butyl, secondary butyl), the abbreviation "tBu" refers to a tertiary butyl group, the abbreviation "$^s$Bu" refers to a secondary butyl group, and the abbreviation "$^i$Bu" refers to an isobutyl group.

General abbreviations of elements according to the Periodic Table of the Elements are used in the present specification. Elements are sometimes referred to by these abbreviations (for example, Co refers to cobalt, Si to silicon, Ge to germanium, C to carbon, and the like).

SUMMARY

The present invention has been accomplished to solve at least some of the above-mentioned problems and can be realized as the following aspects or application examples.

Application Example 1

According to one aspect of the invention, there is provided a Ge-containing Co-film forming material for forming a Ge-containing Co film for manufacturing a semiconductor device, the material being a compound represented by general formula (1) below or general formula (2) below:

$$R^1R^2R^3Ge\text{—}Co(CO)_4 \tag{1}$$

(where $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group)

$$Co(CO)_4R^4R^5Ge\text{—}Co(CO)_4 \tag{2}$$

(where $R^4$ and $R^5$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

With the Ge-containing Co-film forming material of such an application example, it is possible to form a film on the substrate so as to form, in a chamber, a Ge-containing Co film including a desired amount of Ge. Since hydrogen, nonaromatic hydrocarbon group, halogeno group or halogenated nonaromatic hydrocarbon group, which is bonded to Ge, has no π electrons and does not have a crosslinked structure, the degree of freedom of rotation of the bond is high. Therefore, it can be easily detached from Ge and removed to the outside of the chamber. As a result, it is unlikely that carbon-based impurities derived from hydrogen, nonaromatic hydrocarbon group, halogeno group or halogenated nonaromatic hydrocarbon group, which is bonded to Ge, will remain inside the Ge-containing Co film formed on the substrate in the chamber. Further, since nonaromatic hydrocarbon groups and halogenated nonaromatic hydrocarbon groups desorb at a relatively low temperature, film formation can be performed at a low temperature of, for example, 350° C. or less. It follows from the above that it is possible to obtain a Ge-containing Co film including fewer carbon-based impurities and including a desired amount of Ge at a low temperature of, for example, 350° C. or less without performing annealing.

Application Example 2

In the Ge-containing Co-film forming material of Application Example 1, the compound represented by the general formula (1) or the general formula (2) may further comprise one or two neutral adduct ligands selected from a group consisting of $NMe_3$, $NEt_3$, $N^iPr_3$, $NMeEt_2$, $NC_5H_5$, $OC_4H_8$, $Me_2O$, $Et_2O$, $Et_2S$, $^nPr_2S$, and $^nBu_2S$.

According to this application example, the fluidity of the compound represented by the general formula (1) or the general formula (2) can be enhanced, and introduction into the chamber can be further facilitated. For example, in the case where the Ge-containing Co-film forming material is a solid material, this material can be liquefied by including the neutral adduct ligand.

As a result of liquefying, the Ge-containing Co-film forming material can be fed under pressure by a carrier gas or can be pumped by a liquid feeding pump. This not only facilitates introduction into the chamber but also facilitates the operations even when filling the container with the Ge-containing Co-film forming material, thereby making it possible to reduce contamination with impurities.

As a method for liquefying, a method for dissolving in a solvent can be also considered, but according to the present application example in which a neutral adduct ligand is included, it is possible to handle the Ge-containing Co-film forming material at a higher concentration.

Application Example 3

The Ge-containing Co-film forming material of Application Example 1 or Application Example 2 may be a compound represented by the general formula (1), wherein $R^1$, $R^2$ and $R^3$ are each independently a hydrocarbon group or a halogenated hydrocarbon group with a carbon number from 1 to 4.

The Ge-containing Co-film forming material of such an application example has a suitable vapor pressure and it is possible to form a Ge-containing Co film at a suitable film formation rate. In addition, the Ge-containing Co-film forming material of such an application example has excellent thermal stability and/or chemical stability, and therefore can be easily handled.

Application Example 4

In the Ge-containing Co-film forming material of Application Example 3, the compound represented by the general formula (1) may be $Et_3Ge\text{—}Co(CO)_4$.

According to this application example, since $Et_3Ge\text{—}Co(CO)_4$, which is a Ge-containing Co-film forming material, is itself liquid at room temperature, this material can be particularly easily supplied to the chamber. Further, the ethyl group bonded to Ge is particularly easily detached to form gaseous ethylene. Therefore, carbon-based impurities derived from the ethyl group are unlikely to remain on the Ge-containing Co film, and it is possible to obtain a Ge-containing Co film having particularly high purity.

Application Example 5

The Ge-containing Co-film forming material of Application Example 1 or Application Example 2 may be a compound represented by the general formula (2), wherein $R^4$ and $R^5$ each independently represent a hydrocarbon group or a halogenated hydrocarbon group with a carbon number from 1 to 4.

According to this application example, the Ge-containing Co-film forming material has a suitable vapor pressure and it is possible to form a Ge-containing Co film at a suitable film formation rate. In addition, according to such an application example, the Ge-containing Co-film forming material can be easily handled because of excellent thermal stability and/or chemical stability.

Further, since there are three Ge atoms and Co atoms (one Ge and two Co atoms), which form the Ge-containing Co film, in a single molecule, it is possible to obtain a faster film formation rate.

Application Example 6

In the Ge-containing Co-film forming material of Application Example 5, the compound represented by the general formula (2) may be $Co(CO)_4Et_2Ge—Co(CO)_4$.

According to this application example, the ethyl group bonded to Ge in the molecule of $Co(CO)_4Et_2Ge—Co(CO)_4$, which is a Ge-containing Co-film forming material, is particularly easily desorbed to form gaseous ethylene. Therefore, carbon-based impurities derived from the ethyl group are unlikely to remain on the Ge-containing Co film, and it is possible to obtain a Ge-containing Co film having particularly high purity.

Application Example 7

According to one aspect of the invention, there is provided a Ge-containing Co film formed by depositing the Ge-containing Co-film forming material according to any one of Application Examples 1 to 6 by a CVD method or an ALD method.

Application Example 8

In the Ge-containing Co film of Application Example 7, the composition ratio Ge:Co ranges from 1:99 to 99:1.

The composition ratio of Ge and Co can be arbitrarily changed depending on the properties of the functional group bonded to the Ge atom, the temperature at the time of film formation, and the like.

Application Example 9

The thickness of the Ge-containing Co film of Application Example 7 or Application Example 8 may range from 0.1 nm to 400 nm.

According to such an application example, a Ge-containing Co film having a film thickness ranging from 0.1 nm to 400 nm can be formed in a recessed portion of the substrate to form the barrier layer. The film thickness of the Ge-containing Co film as the barrier layer can range more preferably from 0.1 nm to 30 nm, and particularly preferably from 0.1 nm to 10 nm.

Further, a Ge-containing Co film having a film thickness ranging from 0.1 nm to 400 nm can be formed on a flat portion of the substrate to form a contact layer. The film thickness of the Ge-containing Co film as the contact layer can range more preferably from 0.1 nm to 50 nm, and particularly preferably from 0.1 nm to 20 nm.

Application Example 10

The Ge-containing Co film of any one of Application Example 7 to Application Example 9 may have a bulk resistance value ranging from preferably 6 $\mu\Omega\cdot cm$ to 300 $\mu\Omega\cdot cm$, more preferably from 10 $\mu\Omega\cdot cm$ to 250 $\mu\Omega\cdot cm$, and particularly preferably from 10 $\mu\Omega\cdot cm$ to 60 $\mu\Omega\cdot cm$.

Since the Ge-containing Co film of this application example has a low bulk resistance value, it is particularly suitable as a barrier layer and/or a contact layer for which a low bulk resistance value is required.

Application Example 11

The Ge-containing Co film of any one of Application Example 7 to Application Example 10 may have a surface roughness (RMS) ranging from 0.01 nm to 15 nm.

The Ge-containing Co film of this application example has a flat surface and is suitable as a barrier layer and/or a contact layer.

Application Example 12

In the case where the Ge-containing Co film of any one of Application Examples 7 to Application Example 11 is formed on a substrate having at least one recessed portion, a ratio of the film thickness on an inner wall surface or an inner bottom surface of the recessed portion to the film thickness on the surface of the substrate may be in the range of 0.2 to 1.1.

Step coverage is one of indices for evaluating the uniformity of the formed film. The concept of step coverage in the present specification will be explained with reference to FIG. 1. FIG. 1 schematically shows a cross section in which a Ge-containing Co film 20 is formed on a substrate 10 and a recessed portion 12 is formed in the substrate 10. The "step coverage" is assumed to be evaluated by comparing the film thickness of the Ge-containing Co film formed on the inner wall surface of the recessed portion (y in FIG. 1) and/or the film thickness of the Ge-containing Co film formed on the inner bottom surface of the recessed portion (z in FIG. 1) with the film thickness of the Ge-containing Co film formed on the surface of the substrate (x in FIG. 1) with respect to the film deposited on the substrate and the film deposited in the recessed portion formed in the substrate. The film thickness on the inner wall surface of the recessed portion is acquired by measuring the film thickness on the inner wall surface at a height (½ Dep) which is ½ of the depth (Dep) of the recessed portion.

The ratio of the film thickness of the Ge-containing Co film formed inside the recessed portion to the film thickness of the Ge-containing Co film formed on the surface of the substrate is in the range of preferably 0.2 to 1.1, more preferably 0.5 to 1.1, and particularly preferably 0.9 to 1.1.

Application Example 13

The Ge-containing Co film of any one of Application Example 7 to Application Example 12 may have a minimum continuous film thickness ranging from 1 nm to 5 nm.

The "minimum continuous film thickness," as referred to in the present specification, means a film thickness at which a value of $R \times d^3$ is minimal at a plot obtained by plotting ($R \times d^3$), which is obtained by multiplying a resistance value (denoted by "R") of the film which is the measurement object by a third power of the thickness (denoted by "d") of the film which is the measurement object, against the film thickness (d).

According to this application example, the obtained Ge-containing Co film has few pinholes and it is possible to obtain a device with good electrical characteristics.

Application Example 14

The Ge-containing Co film of any one of Application Example 7 to Application Example 13 may be a low-resistance contact layer formed on a source/drain region of a FinFET transistor arranged on a Si or Ge substrate.

Application Example 15

The Ge-containing Co film of any one of Application Example 7 to Application Example 13 may be a barrier layer of a wiring layer.

Application Example 16

According to one aspect of the invention; there is provided a semiconductor device comprising the Ge-containing Co film of any one Application Example 7 to Application Example 15.

Application Example 17

According to one aspect of the invention, there is provided an electronic device comprising the semiconductor device of Application Example 16.

The electronic device is not particularly limited and can be; for example; an LCD-TFT device, a photovoltaic device, a flat panel display, an organic solar cell, an organic EL device, an organic thin-film transistor; an organic light emitting sensor, or the like.

Application Example 18

According to one aspect of the invention, there is provided a method for forming a Ge-containing Co film; the method comprising:
a first step of introducing a substrate into a chamber;
a second step of introducing a Ge-containing Co-film forming material represented by general formula (1) below or general formula (2) below into the chamber in which the substrate has been disposed, while controlling an introduction amount of the Ge-containing Co-film forming material; and
a third step of depositing at least a part of the Ge-containing Co-film forming material on the substrate so as to form the Ge-containing Co film

$$R^1R^2R^3Ge\text{---}Co(CO)_4 \quad (1)$$

(where $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group)

$$Co(CO)_4R^5R^6Ge\text{---}Co(CO)_4 \quad (2)$$

(where $R^5$ and $R^6$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

According to this application example, a Ge-containing Co film including a desired amount of Ge can be formed on the substrate.

Application Example 19

In the method for forming a Ge-containing Co film of Application Example 18,
the third step may be selected from a group consisting of chemical vapor deposition (CVD), atomic layer deposition (ALD), plasma enhanced chemical vapor deposition (PECVD), plasma enhanced atomic layer deposition (PEALD), pulsed chemical vapor deposition (PCVD), low-pressure chemical vapor deposition (LPCVD), reduced pressure chemical vapor deposition (SACVD), atmospheric pressure chemical vapor deposition (APCVD), spatial ALD, radical assisted deposition, supercritical fluid deposition, and combinations thereof.

Application Example 20

The method for forming a Ge-containing Co film according to Application Example 18 or Application Example 19 may further comprise:
a fourth step of introducing an additive gas selected from a group consisting of ammonia, hydrogen, an inactive gas, an alcohol, an amino alcohol, an amine, $GeH_4$, $Ge_2H_6$, and combinations thereof into the chamber.

The inactive gas may be any gas that does not react with the Ge-containing Co-film forming material represented by the general formula (1) or the general formula (2) in the chamber, and may be a gas selected from a group consisting of argon, helium, nitrogen, and combinations thereof. The amino alcohol is not particularly limited, and may be, for example, ethanolamine.

According to this application example, it is possible to obtain a Ge-containing Co film having a different Ge:Co ratio by changing the additive gas. Further, by introducing the additive gas, the film formation temperature can be lowered.

Application Example 21

In the method for forming a Ge-containing Co film according to any one of Application Example 18 to Application Example 20, the third step may be carried out at a temperature in the range of 0° C. to 350° C., preferably at a temperature in the range of 100° C. to 250° C., and particularly preferably at a temperature in the range of 160° C. to 200° C.

The temperature at which the third step is carried out is the temperature measured in the chamber (for example, the temperature of the substrate holder or the temperature of the inner wall surface of the chamber).

According to such an application example, it is possible to obtain a substantially uniform Ge-containing Co film having a desired stoichiometric ratio of Ge and Co at a suitable film formation rate. Specifically, in the case where $Et_3Ge\text{---}Co(CO)_4$ is used as a Ge-containing Co-film forming material, it is possible to obtain a Co-rich Ge-containing Co film when forming the film at a lower temperature (for example, 0° C. to 200° C.), and it is possible to obtain a Ge-rich Ge-containing Co film when forming the film at a higher temperature (for example, 300° C. to 350° C.).

This indicates at the possibility of controlling the stoichiometric ratio of Ge and Co in the film, which is to be formed, by the film formation temperature.

Application Example 22

In the method for forming a Ge-containing Co film according to any one of Application Example 18 to Application Example 21, the pressure in the chamber may range from 0.06 Torr to atmospheric pressure, more preferably from 0.1 Torr to 30 Torr, and particularly preferably from 1 Torr to 15 Torr.

With the Ge-containing Co-film forming material of the present invention, it is possible to obtain a Ge-containing Co film at a low temperature without performing the annealing step. In addition, with the method for forming a Ge-containing Co film according to the present invention, the Ge-containing Co film can be formed at a low temperature by using the Ge-containing Co-film forming material.

BRIEF DESCRIPTION OF DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

Figure 1:
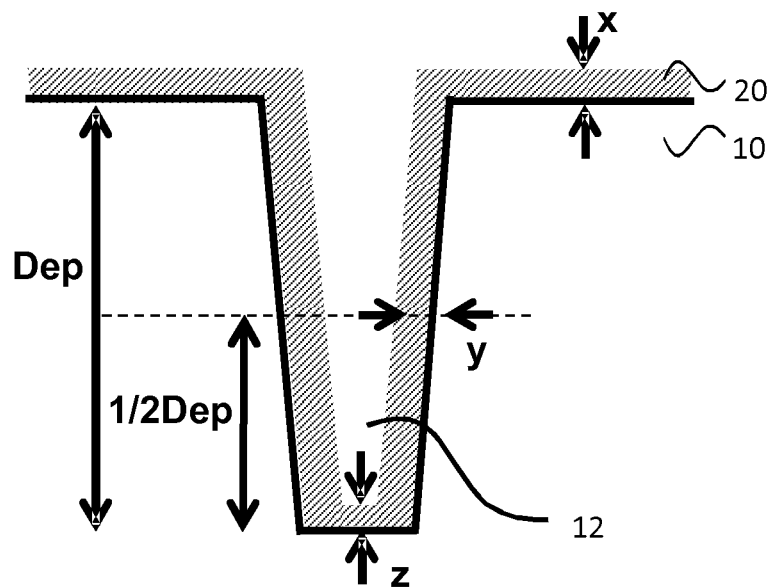
FIG. 1 is a schematic diagram showing a step coverage measurement location used in the present embodiment.

Preferred embodiments of the present invention will be described in detail hereinbelow. It should be understood that the present invention is not limited to the embodiments described hereinbelow and is also inclusive of various modifications that are implemented without departing from the gist of the present invention.

1. Ge-Containing Co-Film Forming Material

A Ge-containing Co-film forming material according to one embodiment of the invention is a material for forming a Ge-containing Co film for manufacturing a semiconductor device, and is a compound represented by general formula (1) below or general formula (2) below

$R^1R^2R^3Ge$—$Co(CO)_4$   (1)

(where $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group)

$Co(CO)_4R^4R^5Ge$—$Co(CO)_4$   (2)

(where $R^4$ and $R^5$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

The Ge-containing Co-film forming material represented by the general formula (1) or the general formula (2) can further include one or two neutral adduct ligands selected from a group consisting of $NMe_3$, $NEt_3$, $N^iPr_3$, $NMeEt_2$, $NC_5H_5$, $OC_4H_8$, $Me_2O$, $Et_2O$, $Et_2S$, $^nPr_2S$, and $^nBu_2S$. $NMe_3$ and $NEt_3$ are further preferable as the neutral adduct ligand.

In one embodiment, the Ge-containing Co-film forming material is the compound represented by the general formula (1), wherein $R^1$, $R^2$ and $R^3$ in the general formula (1) are each independently hydrogen, a nonaromatic hydrocarbon group, a halogeno group or a halogenated nonaromatic hydrocarbon group.

It is preferable that in the compound represented by the general formula (1), $R^1$, $R^2$ and $R^3$ be each independently a hydrocarbon group with a carbon number from 1 to 4 or a halogenated hydrocarbon group with a carbon number from 1 to 4. Examples of the hydrocarbon group with a carbon number from 1 to 4 include alkyl groups such as a methyl group, an ethyl group, an n-propyl group, an isopropyl group, a butyl group, an isobutyl group and a t-butyl group. Examples of the halogenated hydrocarbon group with a carbon number from 1 to 4 include the alkyl groups exemplified hereinabove in which some or all hydrogen atoms are substituted with a halogeno group (—F, —Cl, —Br, —I).

Specific, but not limiting, examples of such a Ge-containing Co-film forming material include $Me_3Ge$—$Co(CO)_4$, $Et_3Ge$—$Co(CO)_4$, $^iPr_3Ge$—$Co(CO)_4$, $^nPr_3Ge$—$Co(CO)_4$, $^nBu_3Ge$—$Co(CO)_4$, $^iBu_3Ge$—$Co(CO)_4$, $^tBu_3Ge$—$Co(CO)_4$, $Me_2EtGe$—$Co(CO)_4$, $MeEt_2Ge$—$Co(CO)_4$, $Me_2HGe$—$Co(CO)_4$, $Et_2HGe$—$Co(CO)_4$, $^iPr_2HGe$—$Co(CO)_4$, $^nPr_2HGe$—$Co(CO)_4$, $^nBu_2HGe$—$Co(CO)_4$, $^iBu_2HGe$—$Co(CO)_4$, $^tBu_2HGe$—$Co(CO)_4$, $MeEtHGe$—$Co(CO)_4$, $F_3Ge$—$Co(CO)_4$, $Cl_3Ge$—$Co(CO)_4$, $Br_3Ge$—$Co(CO)_4$, $I_3Ge$—$Co(CO)_4$, $F_2HGe$—$Co(CO)_4$, $Cl_2HGe$—$Co(CO)_4$, $Br_2HGe$—$Co(CO)_4$, $I_2HGe$—$Co(CO)_4$, $FH_2Ge$—$Co(CO)_4$, $ClH_2Ge$—$Co(CO)_4$, $BrH_2Ge$—$Co(CO)_4$, $IH_2Ge$—$Co(CO)_4$, $(CF_3)_3Ge$—$Co(CO)_4$, $(CCl_3)_3Ge$—$Co(CO)_4$, $(CBr_3)_3Ge$—$Co(CO)_4$, $(CI_3)_3Ge$—

$Co(CO)_4$, $(C_2F_5)_3Ge$—$Co(CO)_4$, $(HC_2F_4)_3Ge$—$Co(CO)_4$, $(H_2C_2F_3)_3Ge$—$Co(CO)_4$, $(H_3C_2F_2)_3Ge$—$Co(CO)_4$, and the like. Of these, $Et_3Ge$—$Co(CO)_4$ is preferable.

In another embodiment, the Ge-containing Co-film forming material is a compound represented by the general formula (2), and in the general formula (2), $R^4$ and $R^5$ are each independently hydrogen, a nonaromatic hydrocarbon group, a halogeno group or a halogenated nonaromatic hydrocarbon group.

It is preferable that in the compound represented by the general formula (2), $R^4$ and $R^5$ be each independently a hydrocarbon group with a carbon number from 1 to 4 or a halogenated hydrocarbon group with a carbon number from 1 to 4.

Examples of the hydrocarbon group with a carbon number from 1 to 4 include alkyl groups such as a methyl group, an ethyl group, an n-propyl group, an isopropyl group, a butyl group, an isobutyl group and a t-butyl group. Examples of the halogenated hydrocarbon group with a carbon number from 1 to 4 include the alkyl groups exemplified hereinabove in which some or all hydrogen atoms are substituted with a halogeno group (—F, —Cl, —Br, —I).

Specific, but not limiting, examples of such a Ge-containing Co-film forming material include $Co(CO)_4Me_2Ge$—$Co(CO)_4$, $Co(CO)_4Et_2Ge$—$Co(CO)_4$, $Co(CO)_4{}^iPr_2Ge$—$Co(CO)_4$, $Co(CO)_4{}^nPr_2Ge$—$Co(CO)_4$, $Co(CO)_4{}^nBu_2Ge$—$Co(CO)_4$, $Co(CO)_4{}^iBu_2Ge$—$Co(CO)_4$, $Co(CO)_4{}^tBu_2Ge$—$Co(CO)_4$, $Co(CO)_4MeEtGe$—$Co(CO)_4$, $Co(CO)_4F_2Ge$—$Co(CO)_4$, $Co(CO)_4Cl_2Ge$—$Co(CO)_4$, $Co(CO)_4Br_2Ge$—$Co(CO)_4$, $Co(CO)_4I_2Ge$—$Co(CO)_4$, $Co(CO)_4FHGe$—$Co(CO)_4$, $Co(CO)_4ClHGe$—$Co(CO)_4$, $Co(CO)_4BrHGe$—$Co(CO)_4$, $Co(CO)_4IHGe$—$Co(CO)_4$, $Co(CO)_4(CF_3)_2Ge$—$Co(CO)_4$, $Co(CO)_4(CCl_3)_2Ge$—$Co(CO)_4$, $Co(CO)_4(CBr_3)_2Ge$—$Co(CO)_4$, $Co(CO)_4(Cl_3)_2Ge$—$Co(CO)_4$, $Co(CO)_4(C_2F_5)_2Ge$—$Co(CO)_4$, $Co(CO)_4(HC_2F_4)_2Ge$—$Co(CO)_4$, $Co(CO)_4(H_2C_2F_3)_2Ge$—$Co(CO)_4$, $Co(CO)_4(H_3C_2F_2)_2Ge$—$Co(CO)_4$, and the like. Of these, $Co(CO)_4Et_2Ge$—$Co(CO)_4$ is preferable.

Synthesis of Ge-Containing Co-Film Forming Material

The Ge-containing Co-film forming material represented by the general formula (1) can be synthesized by adding a Ge compound represented by general formula (3) below to a $Co(CO)_4$ solution under an inactive gas atmosphere. Hydrogen generation is observed during the reaction. As the inactive gas atmosphere, a nitrogen atmosphere or an argon atmosphere can be mentioned, but the inactive gas atmosphere is not limited thereto. As a solvent for forming a solution of $Co(CO)_4$ and/or a Ge compound represented by general formula (3) below, pentane, octane and the like can be mentioned, but the solvent is not limited thereto.

$$R^1R^2R^3GeH \qquad (3)$$

(where $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

The compound represented by the general formula (1) can also be synthesized by dropping a Ge compound represented by the general formula (3) neat, that is, without dissolving in a solvent, on solid $Co(CO)_4$. Further, in some cases, $Co(CO)_4$ may be also present as a dimer $Co_2(CO)_8$.

Furthermore, the compound represented by the general formula (1) can also be synthesized by dissolving the Ge compound represented by the general formula (3) in a solvent and dropping the solution on solid $Co(CO)_4$. As a solvent for preparing the Ge compound as a solution, pentane, octane and the like can be mentioned, but the solvent is not limited thereto.

The Ge-containing Co-film forming material represented by the general formula (2) can be synthesized by adding a Ge compound represented by general formula (4) below to a $Co(CO)_4$ solution under an inactive gas atmosphere. Hydrogen generation is observed during the reaction. As the inactive gas atmosphere, a nitrogen atmosphere or an argon atmosphere can be mentioned, but the inactive gas atmosphere is not limited thereto. As a solvent for forming a solution of $Co(CO)_4$ and/or a Ge compound represented by general formula (4) below, pentane, octane and the like can be mentioned, but the solvent is not limited thereto.

$$R^5R^6GeH_2 \qquad (4)$$

(where $R^5$ and $R^6$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group).

The compound represented by the general formula (2) can also be synthesized by dropping a Ge compound represented by the general formula (4) neat, that is, without dissolving in a solvent, on solid $Co(CO)_4$.

Furthermore, the compound represented by the general formula (2) can also be synthesized by dissolving the Ge compound represented by the general formula (4) in a solvent and dropping the solution on solid $Co(CO)_4$. As a solvent for preparing the Ge compound as a solution, pentane, octane and the like can be mentioned, but the solvent is not limited thereto.

A reactant including the Ge-containing Co-film forming material represented by the general formula (1) or the general formula (2), which has been obtained as described above, can be purified by refluxing and subsequent distillation. Instead of refluxing and subsequent distillation, it may be purified by vacuum distillation or sublimation.

2. Method for Forming Ge-Containing Co Film

A method for forming a Ge-containing Co film according to the present embodiment includes a first step of introducing a substrate into a chamber; a second step of introducing a Ge-containing Co-film forming material represented by the general formula (1) or the general formula (2) into the chamber, in which the substrate has been disposed; and a third step of depositing at least a part of the Ge-containing Co-film forming material on the substrate so as to form the Ge-containing Co film. In addition, the method for forming a Ge-containing Co film according to the present embodiment may include, as necessary, a fourth step of introducing additive gas selected from a group consisting of ammonia, hydrogen, an inactive gas, an alcohol, an amino alcohol, an amine, $GeH_4$, $Ge_2H_6$, and combinations thereof into the chamber. Specific examples of the inactive gas include, but are not limited to, argon, helium, nitrogen, or a combination thereof.

In the method for forming the Ge-containing Co film according to the present embodiment, a CVD (Chemical Vapor Deposition) method or an ALD (Atomic Layer Deposition) method can be used.

In the CVD method, film formation, which is the third step, may be carried out by introducing the Ge-containing Co-film forming material into the chamber in the second step following the first step and then introducing the additive gas in the fourth step. After the first step, the second step may be carried out after carrying out the fourth step.

In the ALD method, film formation, which is the third step, may be carried out following the first step by repeating pulses of introducing the Ge-containing Co-film forming material into the chamber in the second step, then removing the Ge-containing Co-film forming material from the chamber by purging, introducing the additive gas in the fourth step, and removing the additive gas from the chamber by purging. It is also possible to repeat the steps in the order of the fourth step, the purge, the second step, and the purge.

The method for forming a Ge-containing Co film according to the present embodiment can be used, for example, for forming a Ge-containing Co film on a substrate. According to the method for forming a Ge-containing Co film according to the present embodiment, a composition can be obtained in which the composition ratio of Ge and Co in the Ge-containing Co film to be formed can be set to any desired value in the range of Ge:Co=1:99 to 99:1. The composition ratio of Ge and Co can be arbitrarily changed by the characteristics of the functional group bonded to the Ge atom, the temperature at the time of film formation, and the like. The Ge-containing Co film thus formed can be suitably used, for example, as a contact layer or a barrier layer.

Figure 2:
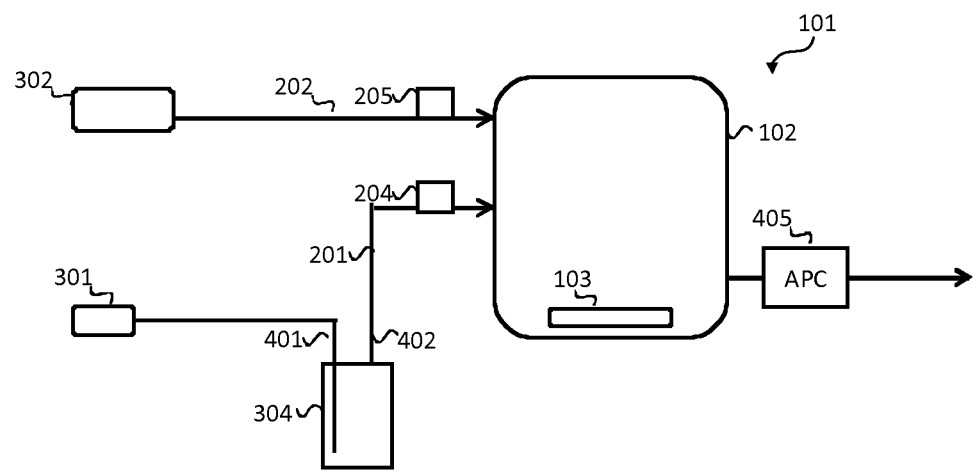
FIG. 2 is a schematic configuration diagram of an apparatus that can be suitably used in the present embodiment.
Figure 3:
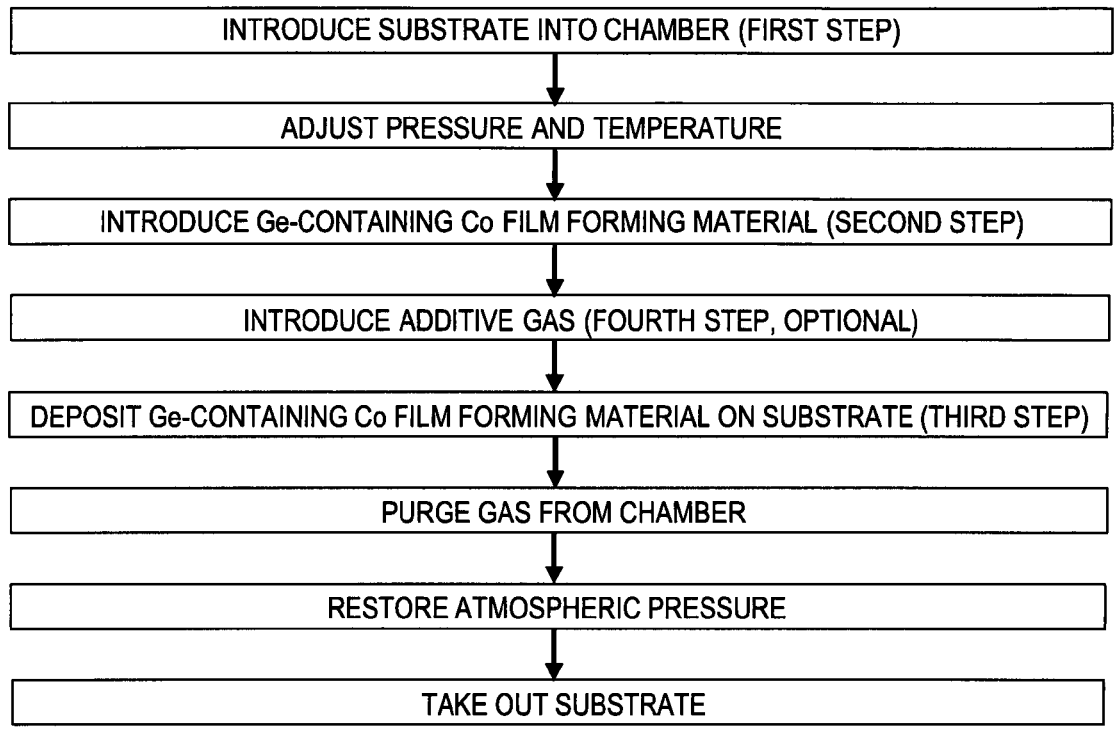
FIG. 3 is a diagram showing the flow of a CVD method according to the present embodiment.

Hereinafter, each step in the method for forming a Ge-containing Co film according to the present embodiment will be described with reference to the drawings. FIG. 2 is a schematic configuration diagram of a CVD apparatus that can be suitably used in the present embodiment. FIG. 3 is a diagram showing the flow of the CVD method according to the present embodiment.

2.1. First Step

In the first step, as shown in FIG. 2, a substrate 103 is introduced into a chamber 102 mounted inside a CVD apparatus 101. At least one substrate 103 is introduced and arranged in the chamber 102. The chamber 102 is not particularly limited as long as it is a chamber 102 where film formation is carried out. Specific examples of suitable chambers include a parallel plate type chamber, a cold wall type chamber, a hot wall type chamber, a single wafer chamber, a multi wafer type chamber, and the like.

The type of the substrate 103 on which the Ge-containing Co film is to be formed varies depending on the end use purpose. In some embodiments, the substrate can be selected from oxides (for example, $ZrO_2$-based materials, $HfO_2$-based materials, $TiO_2$-based materials, rare earth oxide-based materials, ternary oxide-based materials and the like) which are used as dielectric materials in MIM, DRAM or FeRam technology or nitride-based layers (for example, TaN) used as an oxygen barrier between copper and a low-k layer. Other substrates can be used to fabricate semiconductor devices, photovoltaic devices, LCD-TFT devices or flat panel devices. Examples of such substrates include solid substrates such as copper and copper-based alloys such as CuMn; metal-nitride-containing substrates (for example, TaN, TiN, WN, TaCN, TiCN, TaSiN and TiSiN); insulators (for example, $SiO_2$, $Si_3N_4$, SiON, $HfO_2$, $Ta_2O_5$, $ZrO_2$, $TiO_2$, $Al_2O_3$ and barium strontium titanate); or other substrates comprising combinations of any number of these materials, but these examples are not limiting. The actual substrate to be used also depends on the embodiment of the specific compound to be used. In many cases, however, the preferred substrate to be used is selected from a Si substrate and a $SiO_2$ substrate.

After introducing the substrate 103 into the chamber 102, temperature adjustment and pressure adjustment within the chamber 102 are performed as necessary. The temperature in the chamber 102 can be set in the range of 80° C. to 350° C. The pressure in the chamber 102 can be set in the range of 0.1 Torr to 50 Torr.

The pressure in the chamber 102 is set to a predetermined pressure by appropriately adjusting an APC valve 405 connected to the chamber 102.

The temperature in the chamber 102 can be controlled by controlling the temperature of a substrate holder holding the substrate 103, controlling the temperature of the wall surface of the chamber 102, or a combination thereof. A known heating device can be used for heating the substrate 103.

Although the first step in the case of using the CVD apparatus has been described, as another embodiment, the substrate 103 can be introduced into a chamber mounted in an apparatus selected from a group consisting of an ALD apparatus, a PECVD apparatus, a PEALD apparatus, a PCVD apparatus, an LPCVD apparatus, a SACVD apparatus, an APCVD apparatus, a spatial ALD apparatus, a radical assisted film forming apparatus, a supercritical fluid film forming apparatus, and a combination thereof instead of the CVD apparatus 101.

2.2. Second Step and Fourth Step

The second step is a step of introducing the Ge-containing Co-film forming material into the chamber 102 in which the substrate 103 has been disposed. In this case, an additive gas selected from a group consisting of ammonia, hydrogen, an inactive gas, an alcohol, an amino alcohol, an amine, $GeH_4$, $Ge_2H_6$, and a combination thereof can be further introduced (fourth step). Among them, the inactive gas may be any gas which does not react with the Ge-containing Co-film forming material represented by the general formula (1) or the general formula (2) in the chamber 102, and may be a gas selected from a group consisting of argon, helium, nitrogen, or a combination thereof.

The flow rate of the Ge-containing Co-film forming material to be introduced into the chamber 102 is controlled by a Ge-containing Co-film forming material flow rate adjusting mechanism 204. The Ge-containing Co-film forming material flow rate adjusting mechanism 204 is not particularly limited as long as it is a mechanism for controlling the flow rate of the Ge-containing Co-film forming material, and may be, for example, a mass flow controller (hereinafter also referred to as "MFC").

The introduction amount of the Ge-containing Co-film forming material into the chamber 102 may be measured in combination with the flow rate of the carrier gas and is set, for example, in the range of 0.1 SCCM to 2000 SCCM according to the volume of the chamber 102, the characteristics of the Ge-containing Co-film forming material, the surface area of the substrate 103, and the like. When the Ge-containing Co-film forming material is introduced together with the carrier gas, the concentration of the Ge-containing Co-film forming material in the carrier gas varies depending on the characteristics of the Ge-containing Co-film forming material, the temperature of the chamber 102, the pressure, and the like.

The vapor of the Ge-containing Co-film forming material is supplied from a Ge-containing Co-film forming material container 304 into the chamber 102. When the Ge-containing Co-film forming material is in a liquid state, it is possible to supply only the vapor of the Ge-containing Co-film forming material, without the carrier gas, but it is also possible to introduce the carrier gas into the Ge-containing Co-film forming material container 304 and introduce the Ge-containing Co-film forming material together with the carrier gas. The carrier gas is not particularly limited as long as the carrier gas itself does not react with the Ge-containing Co-film forming material. For example, the carrier gas may be selected from a group consisting of ammonia, hydrogen, an inactive gas, and a combination thereof. Among them, an inactive gas is more preferable. Examples of the inactive gas include gases selected from a group consisting of argon, helium, nitrogen, and a combination thereof. It is also possible to perform the introduction by a direct injection method by which droplets of a Ge-containing Co-film forming material are dropped onto a heater and the generated vapor is introduced.

When the Ge-containing Co-film forming material is in a solid state, the Ge-containing Co-film forming material can be supplied by sublimation without the carrier gas, but it is also possible to introduce the carrier gas into the Ge-containing Co-film forming material container 304 and introduce the Ge-containing Co-film forming material together with the carrier gas. For example, the carrier gas may be selected from a group consisting of ammonia, hydrogen, an inactive gas, and a combination thereof. Among them, an inactive gas is more preferable. Examples of the inactive gas include gases selected from a group consisting of argon, helium, nitrogen, and a combination thereof.

The Ge-containing Co-film forming material container 304 can be heated, as necessary, by a known heating means so that the Ge-containing Co-film forming material has a sufficient vapor pressure. The temperature at which the Ge-containing Co-film forming material container 304 is maintained is, for example, in the range of 0° C. to 100° C. in accordance with the characteristics of the Ge-containing Co-film forming material such as thermal stability, vapor pressure and the like.

As the Ge-containing Co-film forming material container 304, a known bubbling container, a sublimation container, or the like can be used.

The Ge-containing Co-film forming material may further include one or two neutral adduct ligands selected from a group consisting of $NMe_3$, $NEt_3$, $N^iPr_3$, $NMeEt_2$, $NC_5H_5$, $OC_4H_8$, $Me_2O$, $Et_2O$, $Et_2S$, $^nPr_2S$, and $^nBu_2S$. In the case where the Ge-containing Co-film forming material is solid at the usage temperature, it is possible to facilitate the supply to the chamber 102 by including the neutral adduct ligand and imparting high fluidity.

In the fourth step, the additive gas introduced into the chamber 102 may be supplied from an additive gas container 302 to the chamber 102. In this case, the flow rate of the additive gas introduced into the chamber 102 is controlled by an additive gas flow rate adjusting mechanism 205 disposed in the additive gas supply pipe 202.

In the fourth step, the additive gas may be introduced into the chamber 102 as a carrier gas of the Ge-containing Co-film forming material. In this case, the additive gas is supplied from the additive gas container 301 and introduced into the chamber 102 via the Ge-containing Co-film forming material container 304. The flow rate of the additive gas may be controlled by the Ge-containing Co-film forming material flow rate adjusting mechanism 204 or may be controlled by a flow rate adjusting mechanism (not shown) arranged in a carrier gas supply pipe 401. The additive gas to be supplied to the Ge-containing Co-film forming material container 304 as a carrier gas may be any gas selected from a group consisting of ammonia, hydrogen, an inactive gas, and a combination thereof, but is preferably an inactive gas, and particularly preferably nitrogen or argon.

In the fourth step, the additive gas may be supplied to the chamber 102 from both the additive gas container 301 and the additive gas container 302. The gas supplied from the additive gas container 301 and the gas supplied from the additive gas container 302 may be the same or different. In the case of supplying different additive gases, the combination thereof can be arbitrarily determined. For example, nitrogen gas may be supplied from the additive gas container 301 and ammonia gas may be supplied from the additive gas container 302.

2.3. Third Step

The third step is a step of depositing at least a part of the Ge-containing Co-film forming material on the substrate 103 so as to form a Ge-containing Co film. In the third step, in order to form a Ge-containing Co film on the substrate 103, any CVD method known to a person skilled in the art can be used.

The Ge-containing Co-film forming material introduced into the chamber 102 decomposes in the gas phase and is deposited on the substrate 103, thereby forming a Ge-containing Co film. The Ge-containing Co-film forming material may be introduced into the chamber 102 in a gaseous state, or may be decomposed in the gas phase after being introduced into the chamber 102 in a liquid state.

The third step is preferably carried out at a temperature in the range of 0° C. to 350° C., more preferably 100° C. to 250° C., and particularly preferably 160° C. to 200° C. The temperature at which the third step is carried out is the temperature measured in the chamber (for example, the temperature of the substrate holder or the temperature of the inner wall surface of the chamber). According to the method for forming a Ge-containing Co film according to the present embodiment, the Ge-containing Co film can be formed at a low temperature, but "low temperature" in the present specification means a temperature of 350° C. or less.

Further, according to the method for forming a Ge-containing Co film according to the present embodiment, it is possible to obtain a substantially uniform Ge-containing Co film having a desired stoichiometric ratio of Ge and Co at a suitable film formation rate. Specifically, in the case where $Et_3Ge—Co(CO)_4$ is used as the Ge-containing Co-film forming material, a Co-rich Ge-containing Co film can be obtained when forming the film at a lower temperature (for example, 0° C. to 200° C.), and a Ge-rich Ge-containing Co film can be obtained when the film is formed at a higher temperature (for example, 300° C. to 350° C.). This indicates that it is possible to control the stoichiometric ratio of Ge and Co in the deposited film by the film formation temperature.

In the method for forming a Ge-containing Co film according to the present embodiment, the pressure in the chamber ranges preferably 0.06 Torr to atmospheric pressure, more preferably 0.1 Torr to 30 Torr, and particularly preferably 1 Torr to 15 Torr. Men the pressure in the chamber is in the above range, a state in which an appropriate amount of the Ge-containing Co-film forming material is present in the chamber can be maintained, and a Ge-containing Co film can be formed at a suitable film formation rate.

The additive gas can be treated with plasma to decompose the additive gas into a radical form thereof. The plasma may be generated or may be present in the chamber 102 itself. The plasma may be located at a distance from the chamber 102, for example in a remotely located plasma system.

For example, an additive gas may be introduced into a DC plasma reactor arranged in the chamber 102 (not shown) and serving for generating plasma, and a plasma treatment reaction gas may be generated in the chamber 102. An exemplary DC plasma reactor is a Titan (trademark) PECVD system from Trion Technology, Inc. The additive gas can be introduced and held in the chamber 102 before the plasma treatment. In another embodiment, the plasma treatment may be performed simultaneously with the introduction of the additive gas. In situ plasma is usually a capacitively coupled plasma of 13.56 MHz RF generated between a showerhead and the substrate holder. The substrate or the shower head may be a power supply electrode, depending on whether or not a cation collision occurs. Typical applied power in an in situ plasma generator is approximately 50 W to approximately 1000 W. Dissociation of reactive gases by using in situ plasma usually cannot be accomplished using a remote plasma source with the same power supply input and, therefore, while the in situ plasma system is not as efficient as a remote plasma system in reactive gas dissociation, it may be beneficial for forming a Ge-containing Co film on the substrate 103 which can be easily damaged by plasma.

The Ge-containing Co-film forming material and the one or more additive gases can be introduced simultaneously (CVD), sequentially (ALD) or in other combinations into the chamber 102. For example, the Ge-containing Co-film forming material can be introduced in one pulse and the additive gas can be introduced in a separate pulse. In addition, the chamber 102 may already include an additive gas before the Ge-containing Co-film forming material is introduced therein.

In the present embodiment, the case where the third step is performed by the CVD method has been described, but a suitable method can be selected, instead of the CVD method, from a group consisting of atomic layer deposition (ALD), plasma enhanced chemical vapor deposition (PECVD), plasma enhanced atomic layer deposition (PEALD), pulsed chemical vapor deposition (PCVD), low-pressure chemical vapor deposition (LPCVD), reduced pressure chemical vapor deposition (SACVD), atmospheric pressure chemical vapor deposition (APCVD), spatial ALD, radical assisted deposition, and supercritical fluid deposition.

For example, a Ge-containing Co-film forming material may be continuously introduced into the chamber 102 and the additive gas may be introduced in pulses (PCVD). The additive gas can be passed through a plasma system localized in the chamber 102 or separately from the chamber 102 and decomposed into radicals.

In either case, a purge or evacuation step can be performed after the pulses to remove components introduced in excessive amounts. In either case, the pulse can last for a period ranging from about 0.01 sec to about 30 sec, alternatively from about 0.3 sec to about 3 sec, and alternatively from about 0.5 sec to about 2 sec.

For example, a susceptor grasping several wafers can be rotated (spatial ALD) while simultaneously spraying the Ge-containing Co-film forming material and one or more additive gases from a shower head.

The composition ratio of Ge and Co in the Ge-containing Co film formed on the substrate 103 can be Ge:Co=1:99 to 99:1, and preferably 1:99 to 70:30. The composition ratio of Ge and Co in the Ge-containing Co film can be set to a desired value by changing the type of the Ge-containing Co-film forming material to be introduced and the temperature and pressure inside the chamber 102. The composition ratio of Ge and Co can be arbitrarily changed by changing the characteristics of the functional group bonded to the Ge atom, the temperature and pressure during film formation, and the like.

The film thickness of the Ge-containing Co film formed on the substrate 103 ranges preferably from 0.1 nm to 400 nm. For example, in the case of forming a Ge-containing Co film on a substrate provided with a recessed portion, a barrier layer can be formed by forming a Ge-containing Co film having a desired film thickness in the recessed portion of the substrate. When the Ge-containing Co film is used as the barrier layer, the film thickness of the Ge-containing Co film ranges more preferably from 0.1 nm to 30 nm, and particularly preferably from 0.1 nm to 10 nm. Further, when forming a Ge-containing Co film on a flat portion on the substrate, a Ge-containing Co film can be used as a contact layer. When the Ge-containing Co film is used as the contact layer, the film thickness of the Ge-containing Co film ranges more preferably from 0.1 nm to 50 nm, and particularly preferably from 0.1 nm to 20 nm. In order to obtain a Ge-containing Co film having a desired film thickness, the Ge-containing Co-film forming material can be continuously introduced into the chamber 102 until the desired film thickness is obtained. When the Ge-containing Co-film forming material is introduced into the chamber 102 with pulses, the desired film thickness can be obtained by changing the number of pulses.

Further, in order to obtain a Ge-containing Co film of a desired film thickness, the obtained Ge-containing Co film may be subjected, as necessary, to further processing such as thermal annealing, furnace annealing, rapid thermal annealing, UV curing or electron beam curing and/or plasma gas exposure.

Known systems can be used to perform these additional processing steps. For example, the Ge-containing Co film may be exposed to a temperature in the range of approximately 200° C. to approximately 1000° C. for approximately 0.1 sec to approximately 7200 sec under an inert atmosphere, a hydrogen-containing atmosphere, a nitrogen-containing atmosphere, an oxygen-containing atmosphere, or a combination thereof.

Preferably, the exposure is at a temperature in the range from 350° C. to 450° C. for 3000 sec to 4000 sec under an H-containing atmosphere. Since the resulting film contains fewer impurities, the density is improved and consequently the leakage current can be improved. The annealing step can be carried out in the same reaction chamber as that in which the deposition process is carried out. Alternatively, the substrate may be removed from the reaction chamber and the annealing/flash annealing process may be performed in a separate apparatus. Any of the above-described aftertreatment methods, particularly thermal annealing is expected to effectively reduce any carbon contamination and nitrogen contamination of the cobalt-containing film. This is expected to improve the resistivity of the film.

The bulk resistance value of the Ge-containing Co film ranges preferably from 6 $\mu\Omega\cdot$cm to 300 $\mu\Omega\cdot$cm, more preferably from 10 $\mu\Omega\cdot$cm to 250 $\mu\Omega\cdot$cm, particularly preferably from 10 $\mu\Omega\cdot$cm to 60 $\mu\Omega\cdot$cm. When the bulk resistance value of the Ge-containing Co film is within the above ranges, the bulk resistance value is sufficiently low, so that the film is suitable as a barrier layer or a contact layer requiring a low bulk resistance value.

The surface roughness (RMS) of the Ge-containing Co film ranges, for example, from 0.01 nm to 15 nm. When the surface roughness of the obtained Ge-containing Co film is within the above range, the surface of the film can be evaluated as flat and the film can be said to be suitable as the barrier layer and/or the contact layer. The "surface roughness", as referred to in the present specification, means a root mean square roughness (RMS) of the film measured by AFM when the measurement range is 10 $\mu$m×10 $\mu$m.

It is preferable that the Ge-containing Co film have a minimum continuous film thickness ranging from 1 nm to 5 nm. The "minimum continuous film thickness", as referred to in the present specification, means a film thickness at which a value of R×d³ is minimal at a plot obtained by plotting (R×d³), which is obtained by multiplying a resistance value (denoted by "R") of the film which is the measurement object by a third power of the thickness (denoted by "d") of the film which is the measurement object, against the film thickness (d). When the minimum continuous film thickness of the Ge-containing Co film is within the above range, a Ge-containing Co film with few pinholes can be obtained and a device with good electrical characteristics can be obtained.

In the case where the Ge-containing Co film is formed on a substrate having at least one recessed portion, the ratio of the film thickness of the Ge-containing Co film formed on the inner wall surface of the recessed portion (y in FIG. 1) and/or the film thickness of the Ge-containing Co film formed on the inner bottom surface of the recessed portion (z in FIG. 1) to the film thickness of the Ge-containing Co film formed on the surface of the substrate (x in FIG. 1) is preferably in the range of 0.2 to 1.1, more preferably 0.5 to 1.1, and particularly preferably 0.9 to 1.1. The film thickness on the inner wall surface of the recessed portion is acquired by measuring the film thickness on the inner wall surface at a height (½ Dep) which is ½ of the depth (Dep) of the recessed portion. According to the method for forming a Ge-containing Co film according to the present embodiment, even when a film is formed on a substrate having at least one recessed portion, it is possible to form a Ge-containing Co film with excellent uniformity of the film thickness on the substrate surface and in the recessed portion. The ratio of the film thickness on the inner wall surface or the inner bottom surface of the recessed portion to the film thickness on the substrate surface is evaluated by the above-described step coverage.

2.4. Final Step

When the Ge-containing Co-film forming material and the additive gas are used, after the Ge-containing Co film has been formed on the substrate 103, the additive gas is removed from the chamber 102 by purging. Further, the pressure inside the chamber 102 is returned to the atmospheric pressure by the APC valve 405, the temperature inside the chamber 102 is returned to the room temperature by the temperature adjustment mechanism, and the substrate 103 is taken out.

EXAMPLES

Hereinafter, the present invention will be specifically described based on examples thereof, but the present invention is not limited to these examples.

Example 1: Synthesis of $Et_3Ge-Co(CO)_4$ $Co_2(CO)_8$ (16.3 g, 0.048 mol) was introduced into a three-necked flask which had a capacity of 250 mL and was equipped with a magnetic stirrer. The atmosphere in the three-necked flask was a nitrogen gas atmosphere. A stopcock, a dropping funnel with a capacity of 50 mL, and a thermocouple were attached to the three-necked flask. $Et_3GeH$ (15.33 g, 0.095 mol) was introduced into the dropping funnel by using a cannula. The three-necked flask was placed in an ice bath at 0° C. In order to completely dissolve $Co_2(CO)_8$, 50 mL of pentane was introduced into the three-necked flask by using a cannula. $Et_3GeH$ was dropped from a dropping funnel into the three-necked flask. An exothermic reaction accompanied by the generation of hydrogen gas occurred, but the dropwise addition was gradually carried out so that hydrogen gas generation and temperature rise did not occur suddenly, Once the generation of hydrogen gas stopped after the dropwise addition of $Et_3GeH$, stirring was conducted at room temperature for 15 h. A brown crude product was obtained. The dropping funnel was detached under an inactive gas atmosphere, a Vigreux tube and a condenser were attached to the three-necked flask, and the crude product was purified by vacuum distillation. A total of 21.7 g of $Et_3Ge-Co(CO)_4$ having a purity of 97% was obtained. The isolated yield was 69%. $Et_3Ge-Co(CO)_4$ was a yellow liquid.

Figure 4:
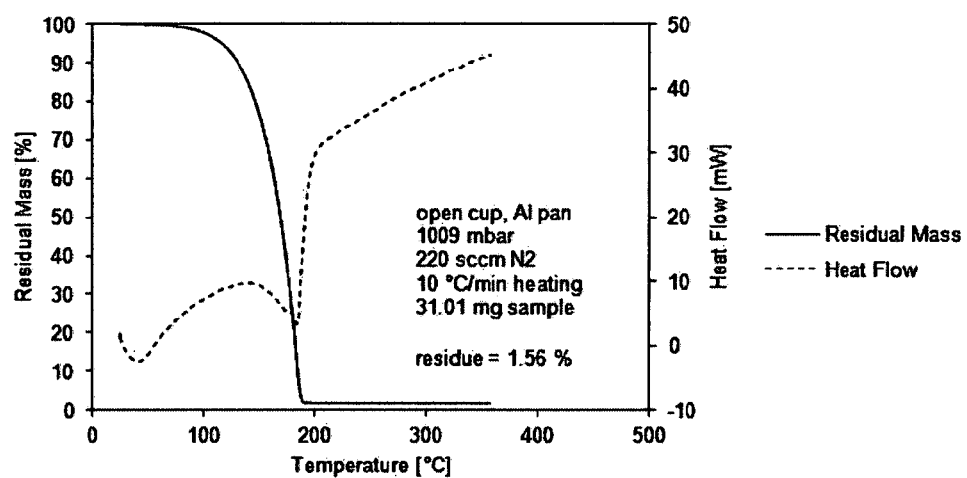
FIG. 4 is a thermal analysis result of $Et_3Ge$—$Co(CO)_4$ in Example 1.

FIG. 4 shows the thermal analysis results on $Et_3Ge-Co(CO)_4$ obtained above. As shown by the solid line in FIG. 4, in the thermogravimetric analysis (TGA), the residue under the atmospheric pressure (1009 mbar) and open cup conditions was 1.56%. TGA/DSC 3+ manufactured by Mettler Toledo was used as a thermogravimetric analyzer.

Figure 5:
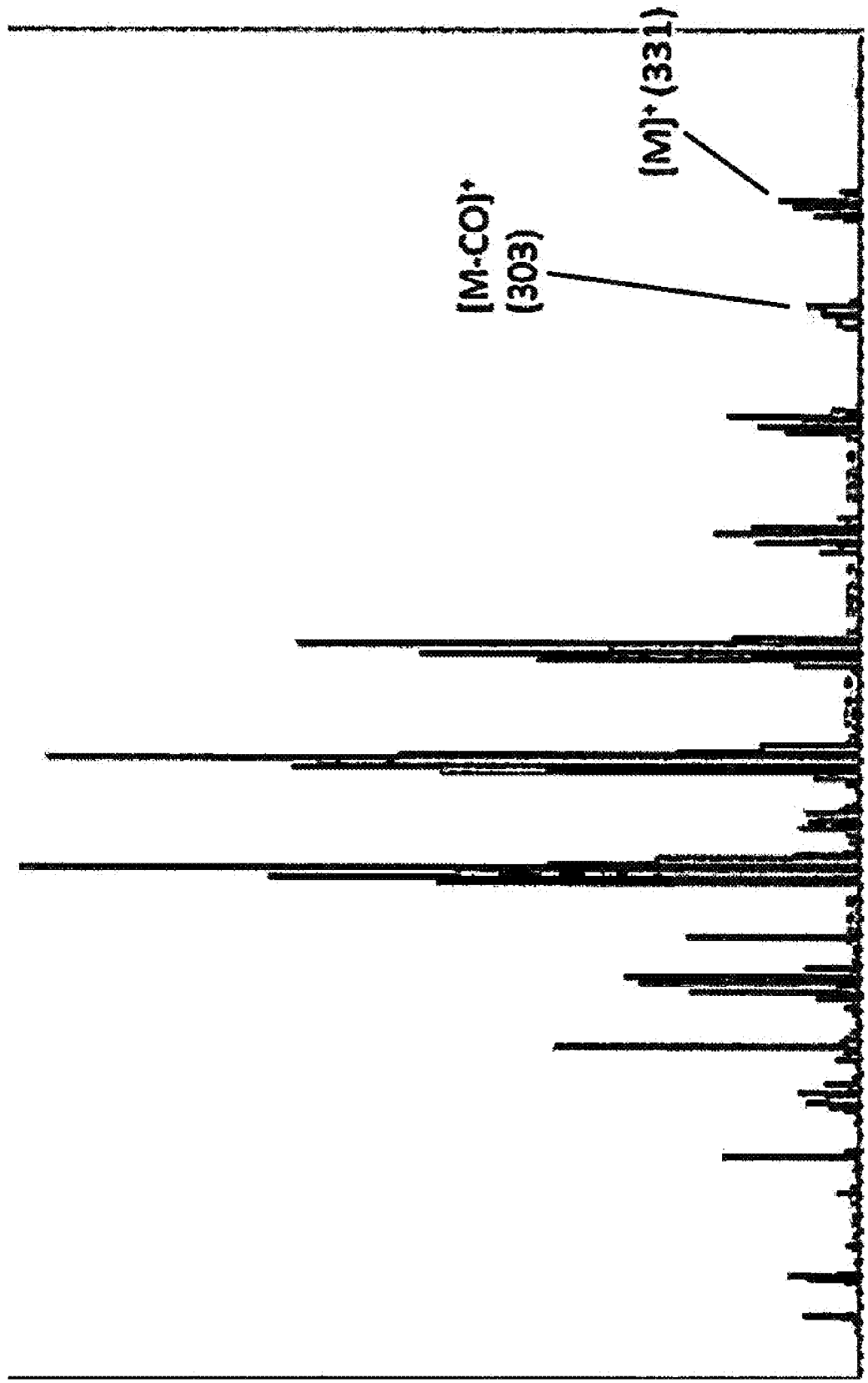
FIG. 5 is a mass spectrum analysis result of $Et_3Ge$—$Co(CO)_4$ in Example 1.

FIG. 5 shows the mass spectral analysis results on $Et_3Ge-Co(CO)_4$ obtained above. As shown in FIG. 5, a molecular ion peak M+331 ($Et_3Ge-Co(CO)_4$ ion) and a CO-detached fragment 303 ($Et_3Ge-Co(CO)_3$ ion) were obtained by mass spectrum analysis (MS). A 5975 Series MSD with a Triple Axis HED-EM Detector manufactured by Agilent Technologies Japan, Ltd, was used as a mass spectrum analyzer.

Figure 6:
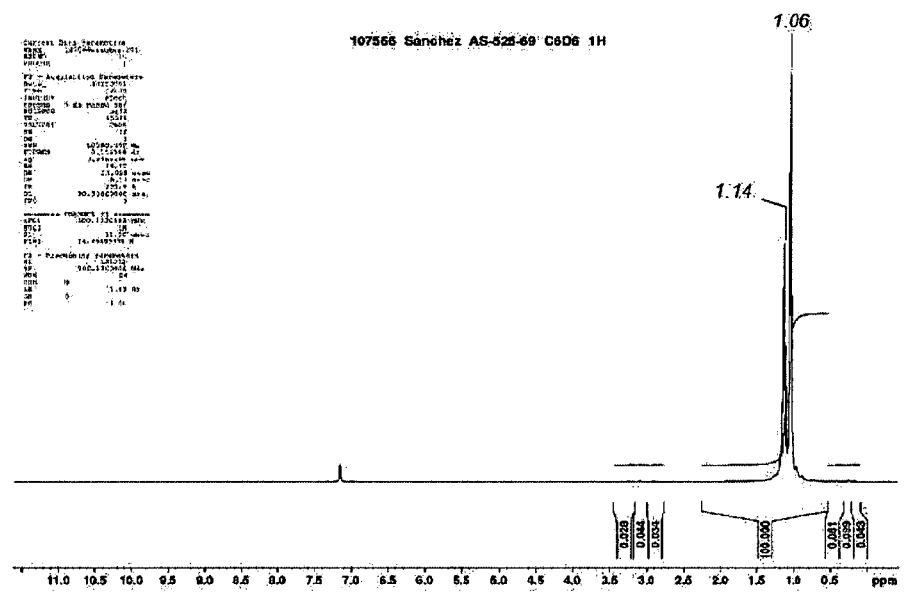
FIG. 6 is a $^1H$-NMR analysis result of $Et_3Ge$—$Co(CO)_4$ in Example 1.

FIG. 6 shows the results of $^1$H-NMR analysis of the $Et_3Ge-Co(CO)_4$ obtained above. As shown in FIG. 6, in the nuclear magnetic resonance method (NMR), $^1$H-NMR was measured using tetramethylsilane as an internal standard by using $C_6D_6$ as a heavy solvent. As a result, the structure of $Et_3Ge-Co(CO)_4$ was confirmed. $^1$H-NMR (δ, $C_6D_6$): 1.06 ppm (t, 6H, $-CH_3$), 1.14 ppm (q, 4H, $-CH_2$).

Figure 7:
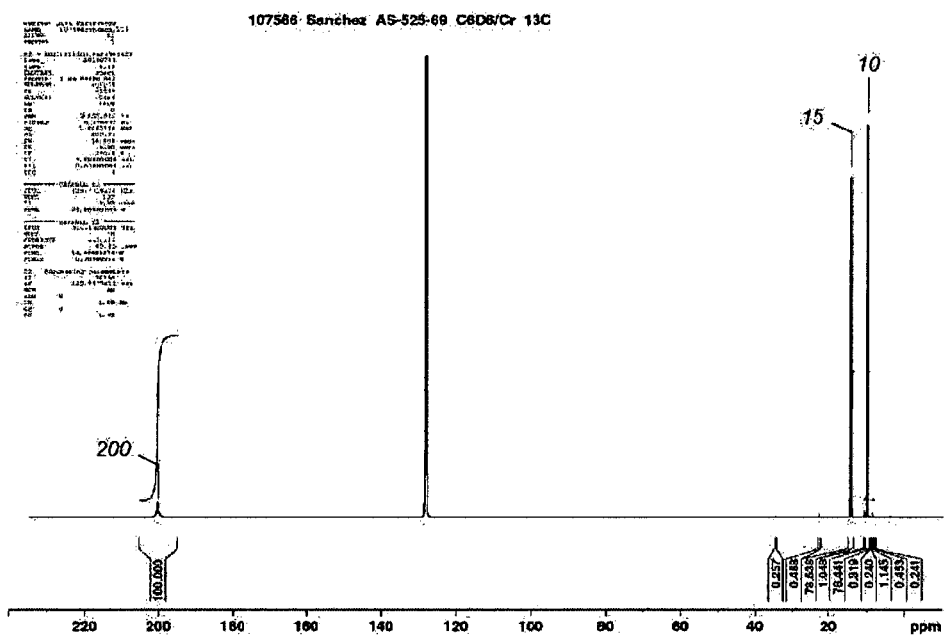
FIG. 7 is a $^{13}C$-NMR analysis result of $Et_3Ge$—$Co(CO)_4$ in Example 1.

FIG. 7 shows $^{13}$C-NMR analysis results on $Et_3Ge-Co(CO)_4$ obtained above. As shown in FIG. 7, $^{13}$C-NMR was similarly measured using tetramethylsilane as an internal standard and using $C_6D_6$ as a heavy solvent. As a result, the structure of $Et_3Ge-Co(CO)_4$ was confirmed. $^{13}$C-NMR (δ, $C_6D_6$): 10 ppm (s, $-CH_3$), 15 ppm (s, $CH_2$), 200 ppm (brs, $-CO$). As the NMR analyzer, a 400 MHz NMR apparatus manufactured by JEOL Ltd. was used.

Figure 8:
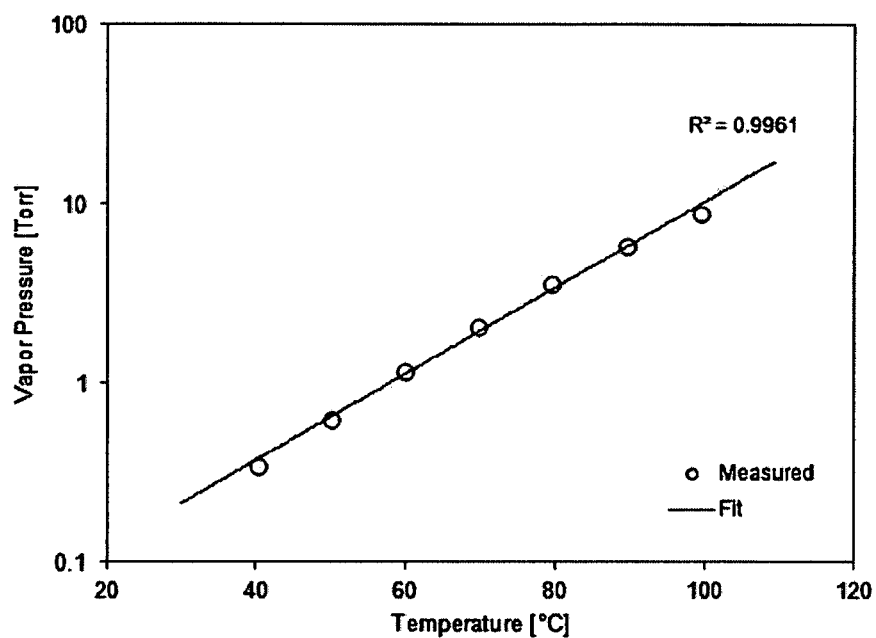
FIG. 8 is a measurement result of vapor pressure of $Et_3Ge$—$Co(CO)_4$ in Example 1.

FIG. 8 shows the vapor pressure measurement results on $Et_3Ge-Co(CO)_4$ obtained above. As shown in FIG. 8, the vapor pressure was measured with the thermogravimetric analyzer TGA/DSC 3+ manufactured by Mettler Toledo, and the vapor pressure of $Et_3Ge-Co(CO)_4$ at 60° C. was about 1.1 Torr. The measurement conditions were a nitrogen gas flow rate of 220 SCCM and a temperature rise rate of 10° C./min, and the vapor pressure was determined by isothermal thermogravimetry.

Figure 9:
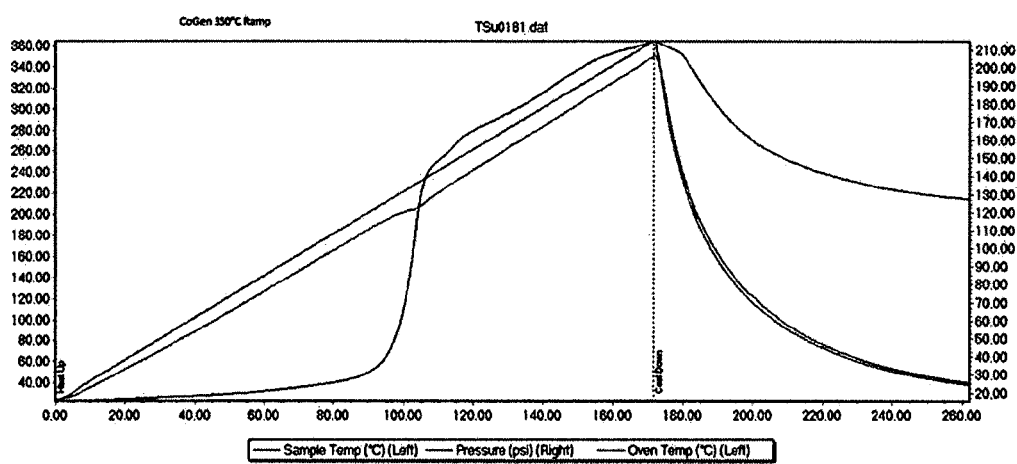
FIG. 9 is a measurement result of temperature and pressure characteristics of $Et_3Ge$—$Co(CO)_4$ in Example 1.

FIG. 9 shows the measurement results on the temperature and pressure characteristic of $Et_3Ge-Co(CO)_4$ obtained above. As shown in FIG. 9, the temperature and pressure characteristic of $Et_3Ge-Co(CO)_4$ was measured using a quartz pressure sensor TSU. As a result, $Et_3Ge-Co(CO)_4$ was thermally stable up to 90° C. It was confirmed that thermal decomposition occurred at a temperature of 90° C. or higher. TSU II made by HEL Group was used for measuring the temperature and pressure characteristic.

Figure 10:
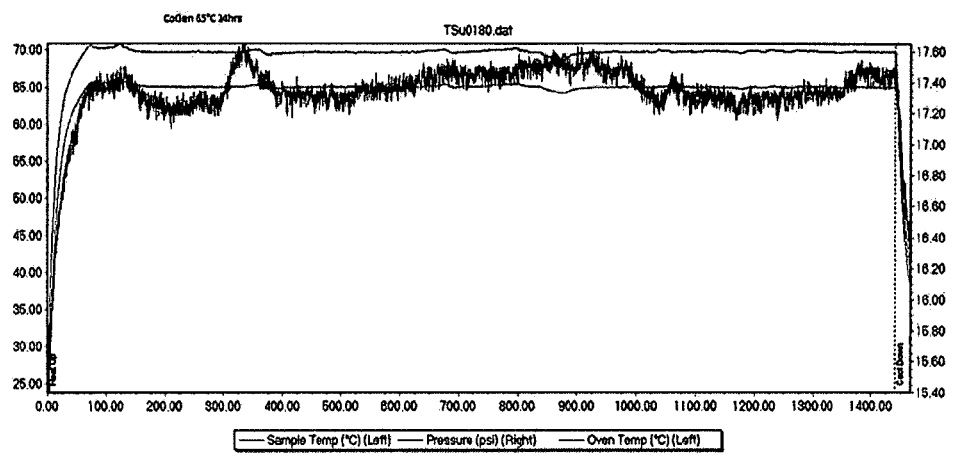
FIG. 10 is a measurement result of thermal stability of $Et_3Ge$—$Co(CO)_4$ in Example 1.

FIG. 10 shows the thermal stability measurement results on $Et_3Ge-Co(CO)_4$ obtained above. As shown in FIG. 10, the thermal stability of $Et_3Ge-Co(CO)_4$ was measured using a quartz pressure sensor TSU. As a result, $Et_3Ge-Co(CO)_4$ showed no pressure rise at 65° C. for 24 h. Therefore, it was confirmed that $Et_3Ge-Co(CO)_4$ was thermally stable at 65° C. TSU II made by HEL Group was used for measuring the temperature and pressure characteristic.

Example 2: Thermal CVD of $Et_3Ge$—$Co(CO)_4$

Figure 11:
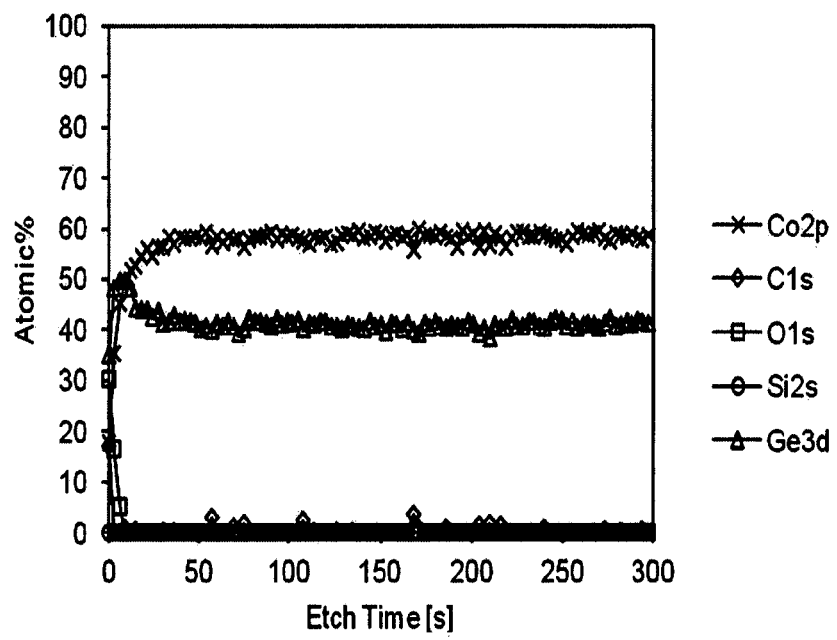
FIG. 11 is an XPS analysis result of a Ge-containing Co film in Example 2.
Figure 12:
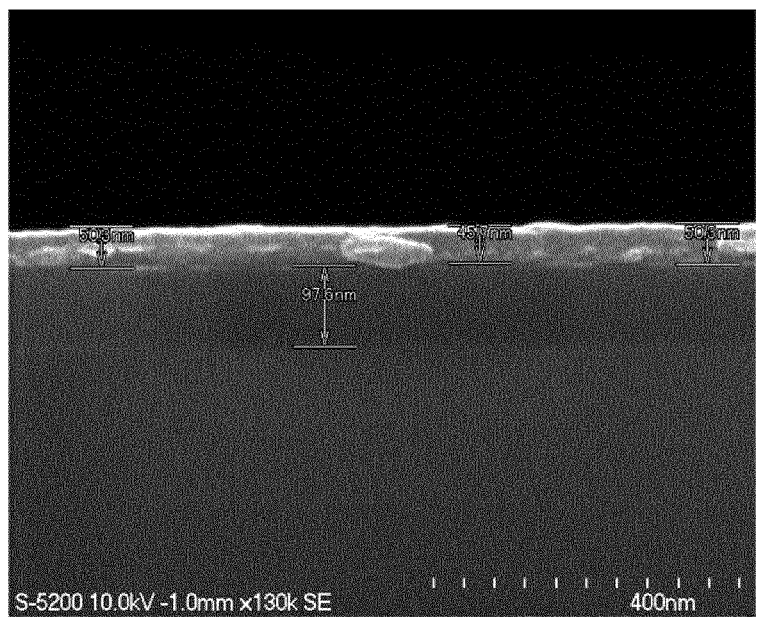
FIG. 12 is a SEM analysis result of a Ge-containing Co film in Example 2.
Figure 13:
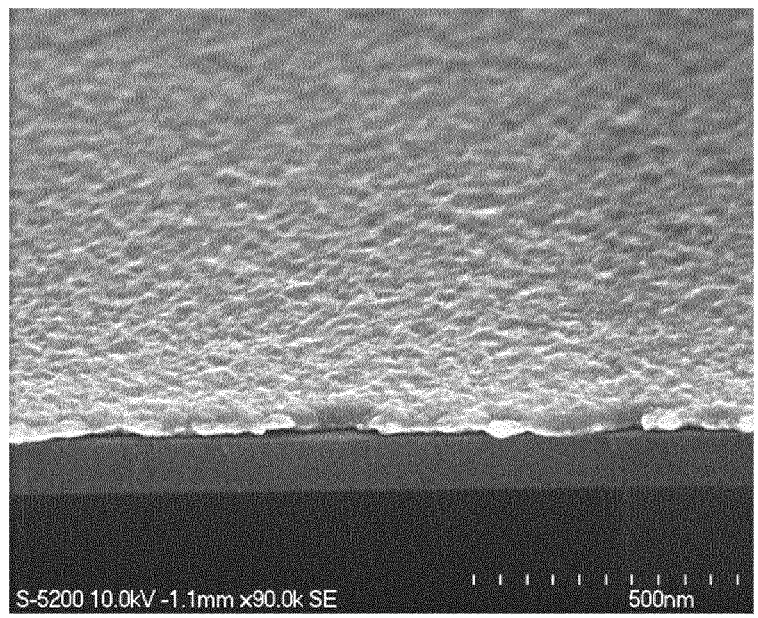
FIG. 13 is a SEM analysis result of a Ge-containing Co film in Example 2.

A Ge-containing Co film was formed on a substrate by a thermal CVD method using $Et_3Ge$—$Co(CO)_4$ as a Ge-containing Co-film forming material, without using an additive gas, under the following conditions. The results of KPS analysis of the film thus obtained are shown in FIG. 11 and the analysis results obtained by SEM are shown in FIGS. 12 and 13.

Film Formation Conditions

Device used: An apparatus having the configuration shown in FIG. 2 was used. A shower head for supplying the Ge-containing Co-film forming material and the carrier gas introduced into the chamber 102 shown in FIG. 2 to the substrate 103 held in the substrate holder in the chamber 102 was attached to the chamber 102. The film formation temperature was controlled by controlling the temperature of the substrate holder.

Ge-containing Co-film forming material: $Et_3Ge$—$Co(CO)_4$

Substrate: $SiO_2$ (cleaned with HF)
Film formation temperature: 200° C.
Pressure in the chamber: 10 Torr
Ge-containing Co-film forming material container temperature: 50° C.
Carrier gas: nitrogen gas
Carrier gas flow rate: 50 SCCM
Film formation time: 60 min
XPS: K-Alpha manufactured by Thermo Fisher Scientific K, K.
SEM: S-5200 manufactured by Hitachi, Ltd.
Resistance meter: Source Meter 4ZA4, manufactured by Keithley Instruments
AFM: MFP-30 manufactured by Asylum Research Corporation FIG. 11 shows the XPS analysis results on the Ge-containing Co film obtained above. As shown in FIG. 11, according to the XPS analysis results, Co atoms are detected at a presence ratio of about 60% and Ge atoms are detected at a presence ratio of about 40% in the bulk of the obtained Ge-containing Co film, and it is clear that a Co-rich CoGe film which is a Ge-containing Co film is formed. The carbon content in the bulk of the obtained Ge-containing Co film was less than 1%, and it can be said that a Ge-containing Co film including few carbon impurities was obtained.

FIG. 12 shows the SEM analysis results on the Ge-containing Co film obtained as described above. As shown in FIG. 12, the film thickness of the obtained Ge-containing Co film was about 50 nm. Since the film formation time was 60 min, the film formation rate was 0.83 nm/min.

FIG. 13 shows the SEM analysis results on the Ge-containing Co film obtained as described above. As shown in FIG. 13, the obtained Ge-containing Co film was a uniform and conformal film.

The step coverage of the Ge-containing Co film formed in a trench having an open groove width of 2 μm and an aspect ratio (open groove width:depth) of 1:7 was as follows.

The ratio of the film thickness of the Ge-containing Co film formed on the inner wall surface of the recessed portion (y in FIG. 1) to the film thickness of the Ge-containing Co film formed on the surface of the substrate (x in FIG. 1) was 0.50 (y/x=0.50).

The ratio of the film thickness of the Ge-containing Co film formed on the inner bottom surface of the recessed portion (z in FIG. 1) to the film thickness of the Ge-containing Co film formed on the surface of the substrate (x in FIG. 1) was 0.29 (z/x=0.29).

The step coverage of the Ge-containing Co film formed in a trench having an open groove width of 0.25 μm and an aspect ratio (open groove width:depth) of 1:20 was as follows.

The ratio of the film thickness of the Ge-containing Co film formed on the inner wall surface of the recessed portion (y in FIG. 1) to the film thickness of the Ge-containing Co film formed on the surface of the substrate (x in FIG. 1) was 0.44 (y/x=0.44).

The ratio of the film thickness of the Ge-containing Co film formed on the inner bottom surface of the recessed portion (z in FIG. 1) to the film thickness of the Ge-containing Co film formed on the surface of the substrate (x in FIG. 1) was 0.36 (z/x=0.36).

The result of measuring the bulk resistance value of the obtained Ge-containing Co film with an ohmmeter was 204 μΩ·cm.

The surface roughness (RMS, root mean square roughness) of the obtained Ge-containing Co film was measured by AFM. The result was 0.97 nm (the measurement range was 10 μm×10 μm).

As another example, the same steps as in Example 2 were carried out using TiN for the substrate, and the same results as in Example 2 were obtained. That is, a Ge-containing Co film including about 60% of Co and about 40% of Ge was obtained by thermal CVD of $Et_3Ge$—$Co(CO)_4$.

Example 3: Thermal CVD of $Et_3Ge$—$Co(CO)_4$

A Ge-containing Co film was formed on a substrate by a thermal CVD method under the same conditions as in Example 2 except that the pressure in the chamber was 1 Torr. The results of measurement of the obtained Ge-containing Co film are shown in Table 1.

Explained hereinbelow are the items described in Table 1.
Film thickness is the thickness (nm) of the Ge-containing Co film measured by SEM.
Film formation rate is a value (nm/min) obtained by dividing the obtained film thickness by the film formation time.
Bulk resistance value is the value (μΩ·cm) measured with an ohmmeter.
Co/Ge ratio is the composition ratio of Co and Ge in the Ge-containing Co film obtained by XPS measurement.
$SC_{1:7}$ (y/x) is the ratio of the film thickness of the Ge-containing Co film formed on the inner wall surface of the recessed portion (y in FIG. 1) to the film thickness of the Ge-containing Co film formed on the surface of the substrate (x in FIG. 1) which was measured in the trench with an aspect ratio of 1:7.
$SC_{1:7}$ (z/x) is the ratio of the film thickness of the Ge-containing Co film formed on the inner bottom surface of the recessed portion (z in FIG. 1) to the film thickness of the Ge-containing Co film formed on the surface of the substrate (x in FIG. 1) which was measured in the trench with an aspect ratio of 1:7.
$SC_{1:20}$ (y/x) is the ratio of the film thickness of the Ge-containing Co film formed on the inner wall surface of the recessed portion (y in FIG. 1) to the film thickness of the Ge-containing Co film formed on the surface of the substrate (x in FIG. 1) which was measured in the trench with an aspect ratio of 1:20.
$SC_{1:20}$ (z/x) is the ratio of the film thickness of the Ge-containing Co film formed on the inner bottom surface of the recessed portion (z in FIG. 1) to the film thickness of the Ge-containing Co film formed on the surface of the substrate (x in FIG. 1) which was measured in the trench with an aspect ratio of 1:20.

Surface roughness is the root mean square roughness (RMS) of the film measured by AFM when the measurement range is 10 μm×10 μm.

Example 4: Thermal CVD of $Et_3Ge$—$Co(CO)_4$

A Ge-containing Co film was formed on a substrate by a thermal CVD method under the same conditions as in Example 2 except that the pressure in the chamber was 16 Torr. The results of measurement of the obtained Ge-containing Co film are shown in Table 1.

Example 5: Thermal CVD of $Et_3Ge$—$Co(CO)_4$

A Ge-containing Co film was formed on a substrate by a thermal CVD method under the same conditions as in Example 2 except that the film formation time was 20 min and $H_2$ was used in addition to the carrier gas (nitrogen gas 50 SCCM) as the additive gas. The introduction amount of $H_2$ gas was set at 10 SCCM. The results of measurement of the obtained Ge-containing Co film are shown in Table 1.

Example 6: Thermal CVD of $Et_3Ge$—$Co(CO)_4$

A Ge-containing Co film was formed on a substrate by a thermal CVD method under the same conditions as in Example 2 except that the film formation time was 20 min and $H_2$ was used in addition to the carrier gas (nitrogen gas 50 SCCM) as the additive gas. The introduction amount of $H_2$ gas was set at 500 SCCM. The results of measurement of the obtained Ge-containing Co film are shown in Table 1.

as an additive gas. In terms of bulk resistance value, good results of 300 μΩ·cm or less were obtained under all conditions. In terms of step coverage, good results of 0.25 or more were obtained in the trench with an aspect ratio of 1:7. In any of Examples 2 to 6, the carbon content in the bulk of the obtained Ge-containing Co film was less than 1%, and it can be said that a Ge-containing Co film including few carbon impurities was obtained. In addition, the Ge-containing Co film obtained in Example 2 had a surface roughness of 0.97 nm and can be said to be a very flat film.

Example 7: Thermal CVD of $Et_3Ge$—$Co(CO)_4$

A Ge-containing Co film was formed on a substrate by a thermal CVD method under the same conditions as in Example 2 except that the film formation temperature was 300° C. and the pressure in the chamber was 1 Torr. The results of measurement of the obtained Ge-containing Co film are shown in Table 2.

Example 8: Thermal CVD of $Et_3Ge$—$Co(CO)_4$

A Ge-containing Co film was formed on a substrate by a thermal CVD method under the same conditions as in Example 2 except that the film formation time was 20 min, the film formation temperature was 300° C., and the pressure in the chamber was 1 Torr. The introduction amount of $NH_3$ gas was set at 10 SCCM. The results of measurement of the obtained Ge-containing Co film are shown in Table 2.

Example 9: Thermal CVD of $Et_3Ge$—$Co(CO)_4$

A Ge-containing Co film was formed on a substrate by a thermal CVD method under the same conditions as in Example 2 except that the film formation time was 20 min,

TABLE 1

| | | Example 2 | Example 3 | Example 4 | Example 5 | Example 6 |
|---|---|---|---|---|---|---|
| Film formation conditions | Ge-containing Co-film forming material | $Et_3Ge$—$Co(CO)_4$ | $Et_3Ge$—$Co(CO)_4$ | $Et_3Ge$—$Co(CO)_4$ | $Et_3Ge$—$Co(CO)_4$ | $Et_3Ge$—$Co(CO)_4$ |
| | Substrate | $SiO_2$ | $SiO_2$ | $SiO_2$ | $SiO_2$ | $SiO_2$ |
| | Film formation temperature (° C.) | 200 | 200 | 200 | 200 | 200 |
| | Pressure inside the chamber (Torr) | 10 | 1 | 16 | 10 | 10 |
| | Container temperature (° C.) | 50 | 50 | 50 | 50 | 50 |
| | Carrier gas | $N_2$ | $N_2$ | $N_2$ | $N_2$ | $N_2$ |
| | Carrier gas flow rate (SCCM) | 50 | 50 | 50 | 50 | 50 |
| | Additive gas | — | — | — | $H_2$ | $H_2$ |
| | Additive gas flow rate (SCCM) | — | — | — | 10 | 500 |
| | Film formation time (min) | 60 | 60 | 60 | 20 | 20 |
| Evaluation results | Film thickness (nm) | 50 | 10 | 28 | 25 | 22 |
| | Film formation rate (nm/min) | 0.83 | 0.17 | 0.47 | 1.25 | 1.10 |
| | Co/Ge ratio | 60/40 | 60/40 | 55/45 | 60/40 | 55/45 |
| | Bulk resistance value (μΩ · cm) | 203 | 263 | — | 237 | 245 |
| | $SC_{1:7}$ (y/x) | 0.50 | — | — | 0.28 | — |
| | $SC_{1:7}$ (z/x) | 0.29 | — | — | 0.31 | — |
| | $SC_{1:20}$ (y/x) | 0.44 | — | — | — | — |
| | $SC_{1:20}$ (z/x) | 0.36 | — | — | — | — |
| | Surface roughness (nm) | 0.97 | — | — | — | — |

It was confirmed that a Co-rich Ge-containing Co film can be obtained in a chamber pressure range of 1 Torr to 16 Torr under the condition that the film formation temperature is 200° C. that is relatively low. Compared with the case where a Co-containing film and a Ge-containing film were separately formed and then annealing was performed to form a Ge-containing Co film, according to Examples 2 to 6, a Ge-containing Co film could be formed at an extremely low temperature. It was confirmed that a Co-rich Ge-containing Co film can be similarly obtained also when $H_2$ gas is used the film formation temperature was 300° C., the pressure in the chamber was 1 Torr, and $NH_3$ gas was used as an additive gas in addition to the carrier gas (nitrogen gas 50 SCCM), The introduction amount of $NH_3$ gas was set at 500 SCCM. The results of measurement of the obtained Ge-containing Co film are shown in Table 2.

Example 10: Thermal CVD of $Et_3Ge$—$Co(CO)_4$

A Ge-containing Co film was formed on a substrate by a thermal CVD method under the same conditions as in Example 2 except that the film formation time was 20 min, the film formation temperature was 300° C., the pressure in the chamber was 1 Torr, and $H_2$ gas was used as an additive gas in addition to the carrier gas (nitrogen gas 50 SCCM), The introduction amount of $H_2$ gas was set at 10 SCCM. The results of measurement of the obtained Ge-containing Co film are shown in Table 2.

Example 11: Thermal CVD of $Et_3Ge$—$Co(CO)_4$

A Ge-containing Co film was formed on a substrate by a thermal CVD method under the same conditions as in Example 2 except that the film formation time was 20 min, the film formation temperature was 300° C., the pressure in the chamber was 1 Torr, and $H_2$ gas was used as an additive gas in addition to the carrier gas (nitrogen gas 50 SCCM), The introduction amount of $H_2$ gas was set at 500 SCCM, The results of measurement of the obtained Ge-containing Co film are shown in Table 2.

Example 12: Thermal CVD of $Et_3Ge$—$Co(CO)_4$

A Ge-containing Co film was formed on the substrate by a thermal CVD method under the same conditions as in Example 2 except that the film formation temperature was 300° C. The results of measurement of the obtained Ge-containing Co film are shown in Table 2.

Example 13: Thermal CVD of $Et_3Ge$—$Co(CO)_4$

A Ge-containing Co film was formed on a substrate by a thermal CVD method under the same conditions as in Example 2 except that the film formation time was 20 min, the film formation temperature was 300° C., and $H_2$ gas was used as an additive gas in addition to the carrier gas (nitrogen gas 50 SCCM). The introduction amount of $H_2$ gas was set at 10 SCCM. The results of measurement of the obtained Ge-containing Co film are shown in Table 2.

Example 14: Thermal CVD of $Et_3Ge$—$Co(CO)_4$

A Ge-containing Co film was formed on a substrate by a thermal CVD method under the same conditions as in Example 2 except that the film formation time was 20 min, the film formation temperature was 300° C., and $H_2$ gas was used as an additive gas in addition to the carrier gas (nitrogen gas 50 SCCM). The introduction amount of $H_2$ gas was set at 500 SCCM. The results of measurement of the obtained Ge-containing Co film are shown in Table 2.

TABLE 2

| | | Example 7 | Example 8 | Example 9 | Example 10 |
|---|---|---|---|---|---|
| Film formation conditions | Ge-containing Co-film forming material | $Et_3Ge$—$Co(CO)_4$ | $Et_3Ge$—$Co(CO)_4$ | $Et_3Ge$—$Co(CO)_4$ | $Et_3Ge$—$Co(CO)_4$ |
| | Substrate | $SiO_2$ | $SiO_2$ | $SiO_2$ | $SiO_2$ |
| | Film formation temperature (° C.) | 300 | 300 | 300 | 300 |
| | Pressure inside the chamber (Torr) | 1 | 1 | 1 | 1 |
| | Container temperature (° C.) | 50 | 50 | 50 | 50 |
| | Carrier gas | $N_2$ | $N_2$ | $N_2$ | $N_2$ |
| | Carrier gas flow rate (SCCM) | 50 | 50 | 50 | 50 |
| | Additive gas | — | — | $NH_3$ | $H_2$ |
| | Additive gas flow rate (SCCM) | — | — | 500 | 10 |
| | Film formation time (min) | 60 | 20 | 20 | 20 |
| Evaluation results | Film thickness (nm) | 276 | 79 | 50 | 104 |
| | Film formation rate (nm/min) | 4.60 | 3.95 | 2.50 | 5.20 |
| | Co/Ge ratio | 40/60 | 40/60 | 40/60 | 40/60 |
| | Bulk resistance value (μΩ · cm) | 37.5 | 61.9 | 49.8 | 55.1 |
| | $SC_{1.7}$ (y/x) | 0.22 | — | — | 0.21 |
| | $SC_{1.7}$ (z/x) | 0.23 | — | — | 0.21 |
| | Surface roughness (nm) | 6.1 | — | — | 3.7 |

| | | Example 11 | Example 12 | Example 13 | Example 14 |
|---|---|---|---|---|---|
| Film formation conditions | Ge-containing Co-film forming material | $Et_3Ge$—$Co(CO)_4$ | $Et_3Ge$—$Co(CO)_4$ | $Et_3Ge$—$Co(CO)_4$ | $Et_3Ge$—$Co(CO)_4$ |
| | Substrate | $SiO_2$ | $SiO_2$ | $SiO_2$ | $SiO_2$ |
| | Film formation temperature (° C.) | 300 | 300 | 300 | 300 |
| | Pressure inside the chamber (Torr) | 1 | 10 | 10 | 10 |
| | Container temperature (° C.) | 50 | 50 | 50 | 50 |
| | Carrier gas | $N_2$ | $N_2$ | $N_2$ | $N_2$ |
| | Carrier gas flow rate (SCCM) | 50 | 50 | 50 | 50 |
| | Additive gas | $H_2$ | — | $H_2$ | $H_2$ |
| | Additive gas flow rate (SCCM) | 500 | — | 10 | 500 |
| | Film formation time (min) | 20 | 60 | 20 | 20 |
| Evaluation results | Film thickness (nm) | 87 | 142 | 50 | 79 |
| | Film formation rate (nm/min) | 4.35 | 2.37 | 2.50 | 3.50 |
| | Co/Ge ratio | 40/60 | 30/70 | 30/70 | 35/65 |
| | Bulk resistance value (μΩ · cm) | 52.4 | 82 | — | 73 |
| | $SC_{1.7}$ (y/x) | — | 0.20 | — | 0.32 |
| | $SC_{1.7}$ (z/x) | — | 0.21 | — | 0.26 |
| | Surface roughness (nm) | — | — | — | — |

Based on the results shown in Table 2, it was confirmed that a Ge-rich Ge-containing Co film can be obtained in a chamber pressure range of 1 Torr to 10 Torr under the condition that the film formation temperature is 300° C. that is relatively high. Compared with the case where a Co-containing film and a Ge-containing film were separately formed and then annealing was performed to form a Ge-containing Co film, according to the present examples, a Ge-containing Co film could be formed at a low temperature. It was confirmed that when a Co-rich film is desired, film formation is performed at a relatively low temperature of about 200° C. and when a Ge-rich film is desired, film formation is performed at a relatively high temperature of about 300° C., which makes it possible to control the Co/Ge composition ratio. It was further confirmed that that a Ge-rich Ge-containing Co film can be similarly obtained also when $NH_3$ gas and $H_2$ gas are used as the additive gas. In terms of bulk resistance value, very good results of 100 $\mu\Omega\cdot cm$ or less were obtained under all conditions. In terms of step coverage, good results of 0.2 or more were obtained in the trench with an aspect ratio of 1:7. In any of Examples 7 to 14, the carbon content in the bulk of the obtained Ge-containing Co film was less than 1%, and it can be said that a Ge-containing Co film including few carbon impurities was obtained. In addition, the Ge-containing Co film obtained in Example 7 had a surface roughness of 6.1 nm and the Ge-containing Co film obtained in Example 10 had a surface roughness of 3.7 nm. Therefore, it can be said that both films are flat films.

Generally, a film forming method capable of producing a film having a high film formation rate and a small bulk resistance value is desired, and in Example 10, a very high film formation rate or 5.20 nm/min and a very low bulk resistance value of 55.1 $\mu\Omega\cdot cm$ of the formed film were obtained. Thus, good results were obtained. Further, in Example 7, a very high film formation rate or 4.60 nm/min and a very low bulk resistance value of 37.5 $\mu\Omega\cdot cm$ of the formed film were obtained. Thus, even better results were obtained.

Example 15: Synthesis of $Et_3GeCo(CO)_4 \cdot 2NEt_3$ $Et_3GeCo(CO)_4$ is added with toluene or dichloromethane to a 100 mL flask. The solution is cooled at −15° C. and liquid triethylamine is slowly added. After addition of the amine, the mixture is warmed to room temperature while stirring to complete the reaction.

After overnight reaction, excess triethylamine is removed under vacuum. The product obtained can be purified by distillation or sublimation under vacuum. In this way, $Et_3GeCo(CO)_4 \cdot 2NEt_3$ can be synthesized.

Example 16: Synthesis of $(CO)_4CoGe(Et)Me_2$ $Co_2(CO)_8$ is added to a 100 mL flask. $GeHEtMe_2$ is slowly added dropwise to the flask at 0° C., The mixture is warmed to room temperature while stirring to complete the reaction, Hydrogen gas is generated after stirring for 5 min, After stirring for 1 h, excess $GeHEtMe_2$ is removed as a gas at room temperature under vacuum. The product obtained can be purified by vacuum distillation. In this way, $(CO)_4CoGe(Et)Me_2$ can be synthesized.

The compound has a structure in which two ethyl groups of $Et_3Ge—Co(CO)_4$ are substituted with methyl groups, and physical and chemical properties of the compound are thought to be similar to those of $Et_3Ge—Co(CO)_4$. Therefore, it can be presumed that the same results can be obtained by using $(CO)_4CoGe(Et)Me_2$ instead of $Et_3Ge—Co(CO)_4$ of Examples 2 to 6.

Example 17: Synthesis of $(CO)_4CoGeEt_2Co(CO)_4$ $Co_2(CO)_8$ is added to a 100 mL flask. $GeHEt_2$ is slowly added dropwise to the flask at 0° C. The mixture is warmed to room temperature while stirring to complete the reaction. Hydrogen gas is generated after stirring for 5 min. After stirring for 1 h, excess $GeHEt_2$ is removed as a gas at room temperature under vacuum. The product obtained can be purified by vacuum distillation. In this way, $(CO)_4CoGeEt_2CO(CO)_4$ can be synthesized.

Example 18: Thermal CVD of $(CO)_4CoGeEt_2Co(CO)_4$

The applicants think that a Ge-containing Co film can be formed on a substrate by a thermal CVD method in the same manner as in Example 2 by using $(CO)_4CoGeEt_2CO(CO)_4$ as the Ge-containing Co-film forming material. Since it is conceivable that $(CO)_4CoGeEt_2Co(CO)_4$ has vapor pressure and chemical properties close to those of $CoGeEt_3Co(CO)_4$, it is expected that thermal CVD can be carried out in the same manner.

Example 19: Predicted ALD of $R^1R^2R^3Ge$—Co $(CO)_4$

The applicants think that by using any of $R^1R^2R^3Ge$—$Co(CO)_4$ disclosed as a Ge-containing Co-film forming material, it is possible to form a Ge-containing Co film by using the ALD method known in the related art and using hydrogen as an additive gas. The compound group is similar in that it does not have an aromatic group as a ligand of Ge, the vapor pressure and chemical properties thereof are thought to be close to those of $CoGeEt_3CO(CO)_4$, and it can be predicted that a Ge-containing Co film can be formed by reaction with hydrogen which is the additive gas.

Example 20: Another Predicted ALD of $R^1R^2R^3Ge$—$Co(CO)_4$

The applicants think that by using any of $R^1R^2R^3Ge$—$Co(CO)_4$ disclosed as a Ge-containing Co-film forming material, it is possible to form a Ge-containing Co film by using the ALD method known in the related art and using ammonia as an additive gas, Ammonia reacts with $R^1R^2R^3Ge$—$Co(CO)_4$ similarly to hydrogen shown in Example 11, which makes it possible to form a Ge-containing Co film.

Example 21: Another Predicted ALD of $R^1R^2R^3Ge$—$Co(CO)_4$

The applicants think that by using any of $R^1R^2R^3Ge$—$Co(CO)_4$ disclosed as a Ge-containing Co-film forming material, it is possible to form a Ge-containing Co film that includes N (GeCoN film) by using the ALD method known in the related art and using hydrogen and ammonia as additive gases. Since the physical and chemical properties of the group of compounds represented by $R^1R^2R^3Ge$—Co $(CO)_4$ are thought to be similar to those of $GeEt_3Co(CO)_4$, it can be predicted that a Ge-containing Co film according to this example will be obtained.

Example 22: Predicted ALD of Co(CO)$_4$R$^4$R$^5$Ge—Co(CO)$_4$

The applicants think that by using any of Co(CO)$_4$R$^4$R$^5$Ge—Co(CO)$_4$ disclosed as a Ge-containing Co-film forming material, it is possible to form a Ge-containing Co film by using the ALD method known in the related art and using hydrogen as an additive gas. Since the vapor pressure and chemical properties of Co(CO)$_4$R$^4$R$^5$Ge—Co(CO)$_4$ are thought to be close to those of CoGeEt$_3$Co(CO)$_4$, it can be predicted that the ALD can be also carried out in the same manner as in Example 11,

Example 23: Another Predicted ALD of Co(CO)$_4$R$^4$R$^5$Ge—Co(CO)$_4$

The applicants think that by using any of Co(CO)$_4$R$^4$R$^5$Ge—Co(CO)$_4$ disclosed as a Ge-containing Co-film forming material, it is possible to form a Ge-containing Co film by using the ALD method known in the related art and using ammonia as an additive gas. It can be predicted that the Ge-containing Co film according to this example can be formed in the same manner as in Example 12 and that the Ge-containing Co film will include nitrogen. Since the physical and chemical properties of Co(CO)$_4$R$^4$R$^5$Ge—Co(CO)$_4$ are thought to be close to those of R$^1$R$^2$R$^3$Ge—Co(CO)$_4$, it can be predicted that the film can be formed in the same manner as in Example 12.

Example 24: Another Predicted ALD of Co(CO)$_4$R$^4$R$^5$Ge—Co(CO)$_4$

The applicants think that by using any of Co(CO)$_4$R$^4$R$^5$Ge—Co(CO)$_4$ disclosed as a Ge-containing Co-film forming material, it is possible to form a Ge-containing Co film by using the ALD method known in the related art and using hydrogen and ammonia as additive gases. This is because physical and chemical properties of the group of compounds represented by Co(CO)$_4$R$^4$R$^5$Ge—Co(CO)$_4$ are thought to be close to those of GeEt$_3$Co(CO)$_4$.

Example 25: Synthesis of Et$_2$Ge—(Co(CO)$_4$)$_2$

Co$_2$(CO)$_8$ (16.3 g, 0.048 mol) was introduced into a three-necked flask which had a capacity of 250 mL and was equipped with a magnetic stirrer. The atmosphere in the three-necked flask was a nitrogen gas atmosphere. A stopcock, a dropping funnel with a capacity of 50 mL, and a thermocouple were attached to the three-necked flask. Et$_2$GeH$_2$ (7 g, 0.053 mol) was introduced into the dropping funnel by using a cannula. The three-necked flask was placed in an ice bath at 0° C. In order to completely dissolve Co$_2$(CO)$_8$, 50 mL of pentane (n-hexane may be also used instead of pentane) was introduced into the three-necked flask by using a cannula. Et$_2$GeH$_2$ was dropped from a dropping funnel into the three-necked flask. An exothermic reaction accompanied by the generation of hydrogen gas occurred, but the dropwise addition was gradually carried out so that hydrogen gas generation and temperature rise did not occur suddenly. Once the generation of hydrogen gas stopped after the dropwise addition of Et$_2$GeH$_2$, stirring was conducted at room temperature for 15 h. A brown crude product was obtained. The dropping funnel was detached under an inactive gas atmosphere, a Vigreux tube and a condenser were attached to the three-necked flask, and the crude product was purified by vacuum distillation under a pressure of 50 mTorr. After the first fraction including Et$_2$GeH$_2$ and the solvent as the main components, when the temperature of the three-necked flask reached about 95° C., 14 g of Et$_2$Ge—(Co(CO)$_4$)$_2$ which was a brown liquid and had a purity of 98% was obtained. The isolated yield was 60%.

Figure 14:
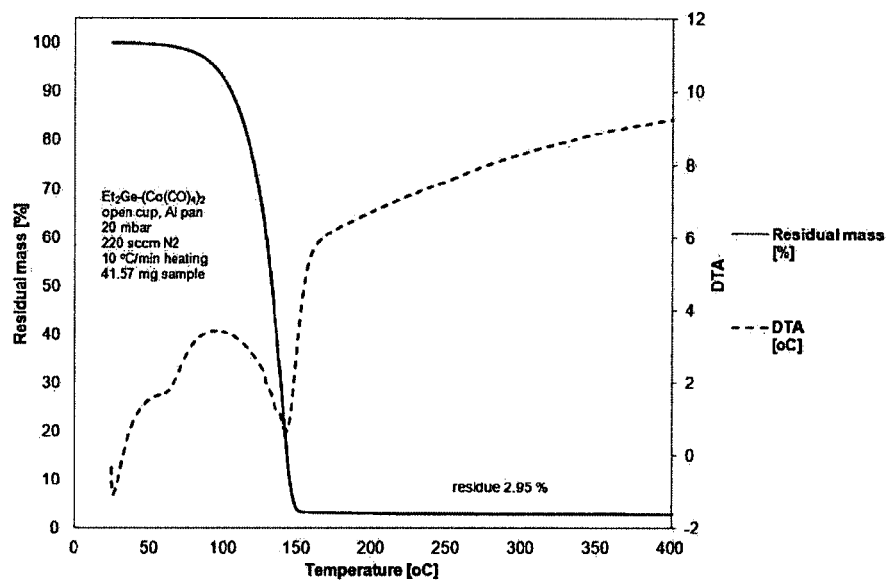
FIG. 14 is a thermal analysis result of $Et_2Ge$—$(Co(CO)_4)_2$ in Example 25.

FIG. 14 shows the thermal analysis results on Et$_2$Ge—(Co(CO)$_4$)$_2$ obtained above. As shown by the solid line in FIG. 14, in the thermogravimetric analysis (TGA), the residue under the reduced pressure (20 mbar) and open cup conditions was 2.95%. TGA/DSC 3+ manufactured by Mettler Toledo was used as a thermogravimetric analyzer.

Figure 15:
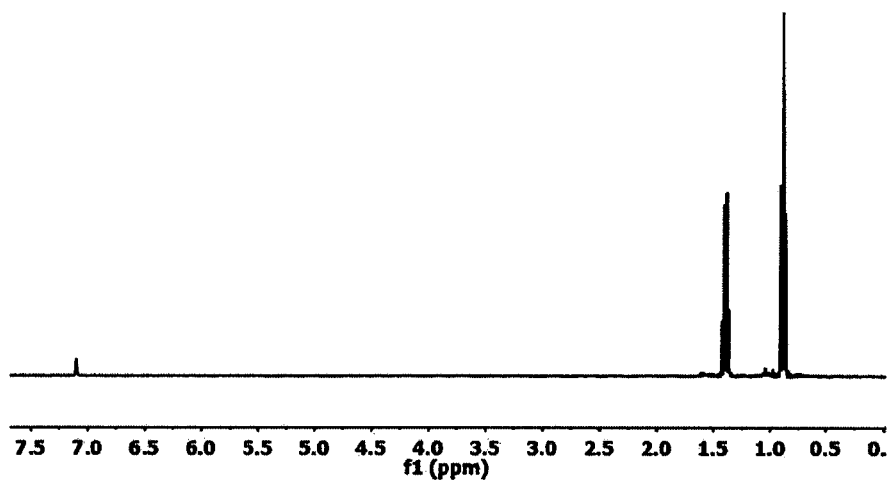
FIG. 15 is a $^1H$-NMR analysis result of $Et_2Ge$—$(Co(CO)_4)_2$ in Example 25.

FIG. 15 shows the results of $^1$H-NMR analysis of the Et$_2$Ge—(Co(CO)$_4$)$_2$ obtained above. As shown in FIG. 15, in the nuclear magnetic resonance method (NMR), $^1$H-NMR was measured using tetramethylsilane as an internal standard by using C$_6$D$_6$ as a heavy solvent. As a result, the structure of Et$_2$Ge—(Co(CO)$_4$)$_2$ was confirmed. $^1$H-NMR (δ, C$_6$D$_8$): 0.95 ppm (t, 6H, —CH$_3$), 1.4 ppm (q, 4H, —CH$_2$).

Figure 16:
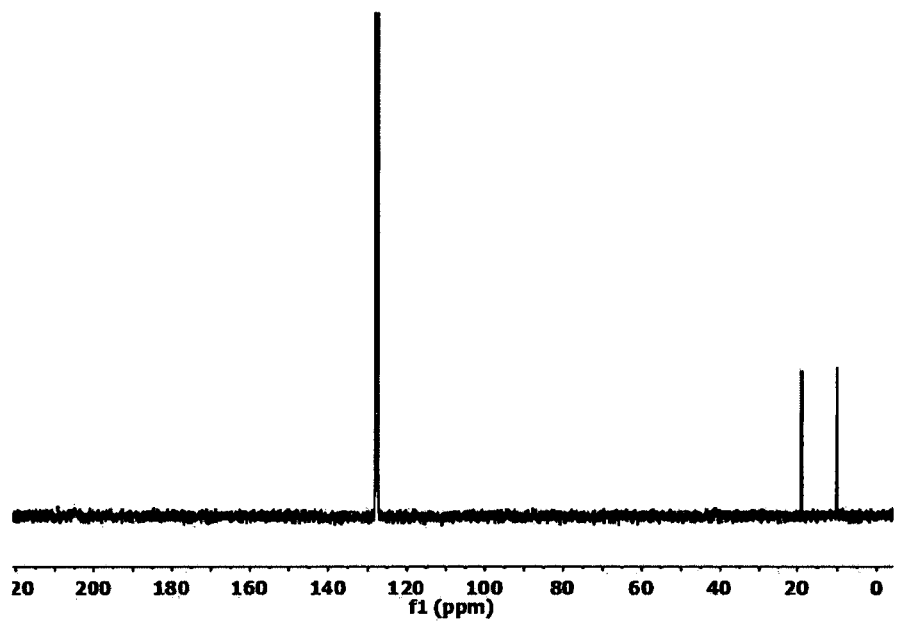
FIG. 16 is a $^{13}C$-NMR analysis result of $Et_2Ge$—$(Co(CO)_4)_2$ in Example 25.

FIG. 16 shows $^{13}$C-NMR analysis results on Et$_2$Ge—(Co(CO)$_4$)$_2$ obtained above. As shown in FIG. 16, $^{13}$C-NMR was similarly measured using tetramethylsilane as an internal standard by using C$_6$D$_8$ as a heavy solvent. As a result, the structure of Et$_2$Ge—(Co(CO)$_4$)$_2$ was confirmed. $^{13}$C-NMR (δ, C$_6$D$_6$): 10.42 ppm (s, —CH$_3$), 19.13 ppm (s, CH$_2$), 205.08 ppm (s, —CO). For the NMR analyzer, a 400 MHz NMR apparatus manufactured by JEOL Ltd. was used.

Figure 17:
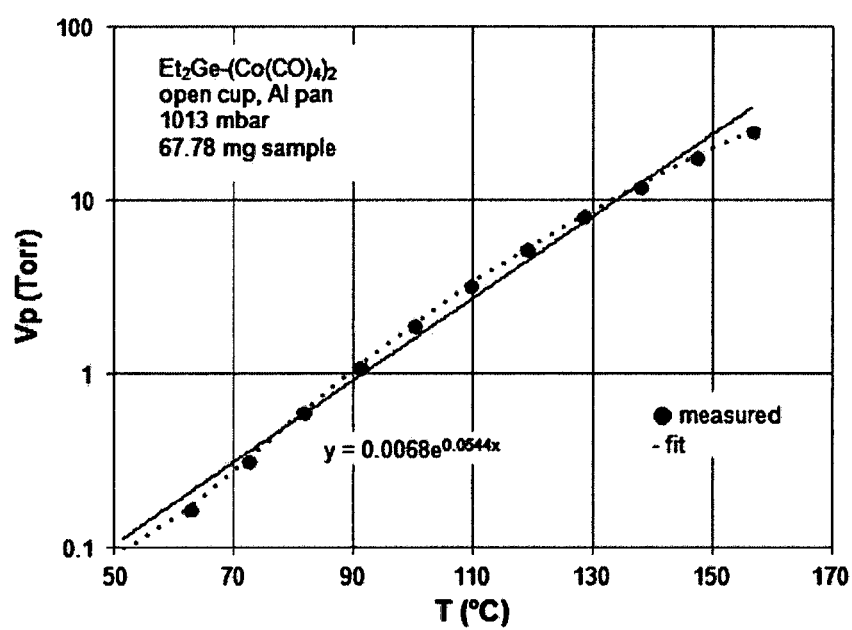
FIG. 17 is a measurement result of vapor pressure of $Et_2Ge$—$(Co(CO)_4)_2$ in Example 25.

FIG. 17 shows the vapor pressure measurement results on Et$_2$Ge—(Co(CO)$_4$)$_2$ obtained above. As shown in FIG. 17, the vapor pressure was measured with the thermogravimetric analyzer TGA/DSC 3+ manufactured by Mettler Toledo, and the vapor pressure of Et$_2$Ge—(Co(CO)$_4$)$_2$ at 90° C. was about 1.1 Torr. The measurement conditions were a nitrogen gas flow rate of 220 SCCM and a temperature rise rate of 10° C./min, and the vapor pressure was determined by isothermal thermogravimetry.

Example 26: Thermal CVD of Et$_2$Ge—(Co(CO)$_4$)$_2$

Figure 18:
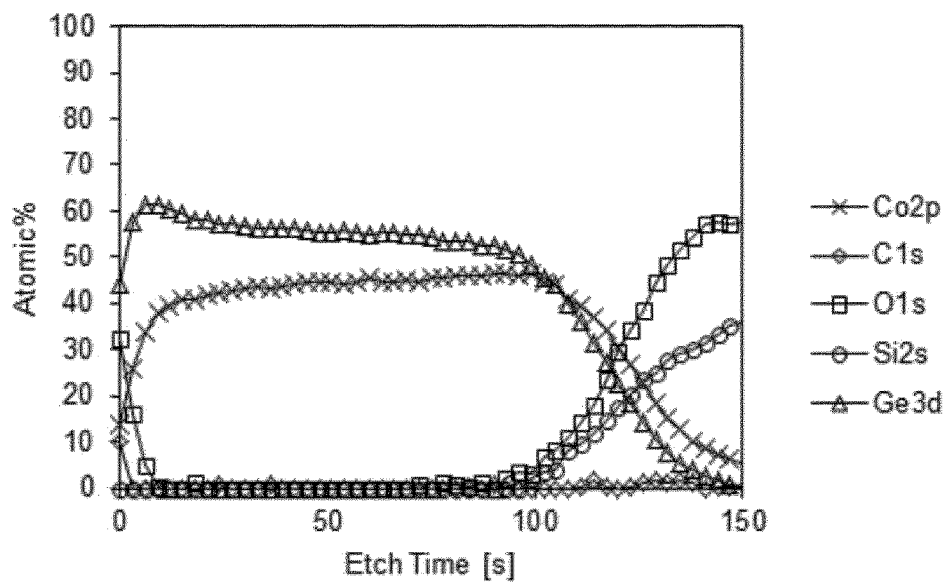
FIG. 18 is an XPS analysis result of a Ge-containing Co film in Example 26.
Figure 19:
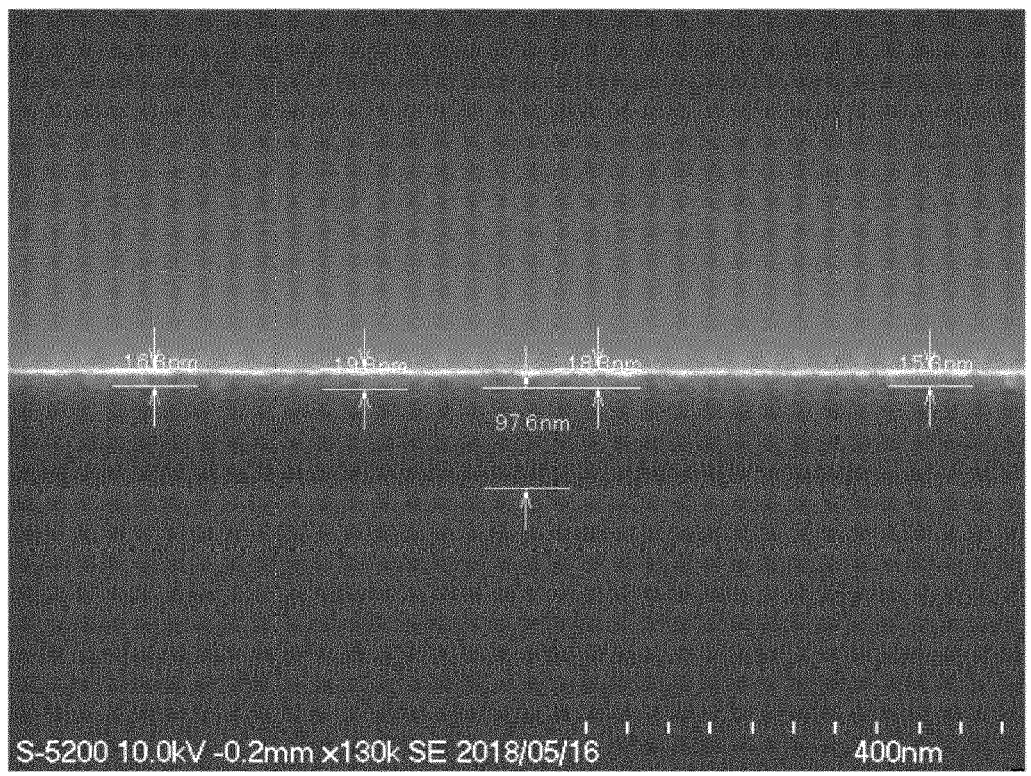
FIG. 19 is a SEM analysis result of a Ge-containing Co film in Example 26.
Figure 20:
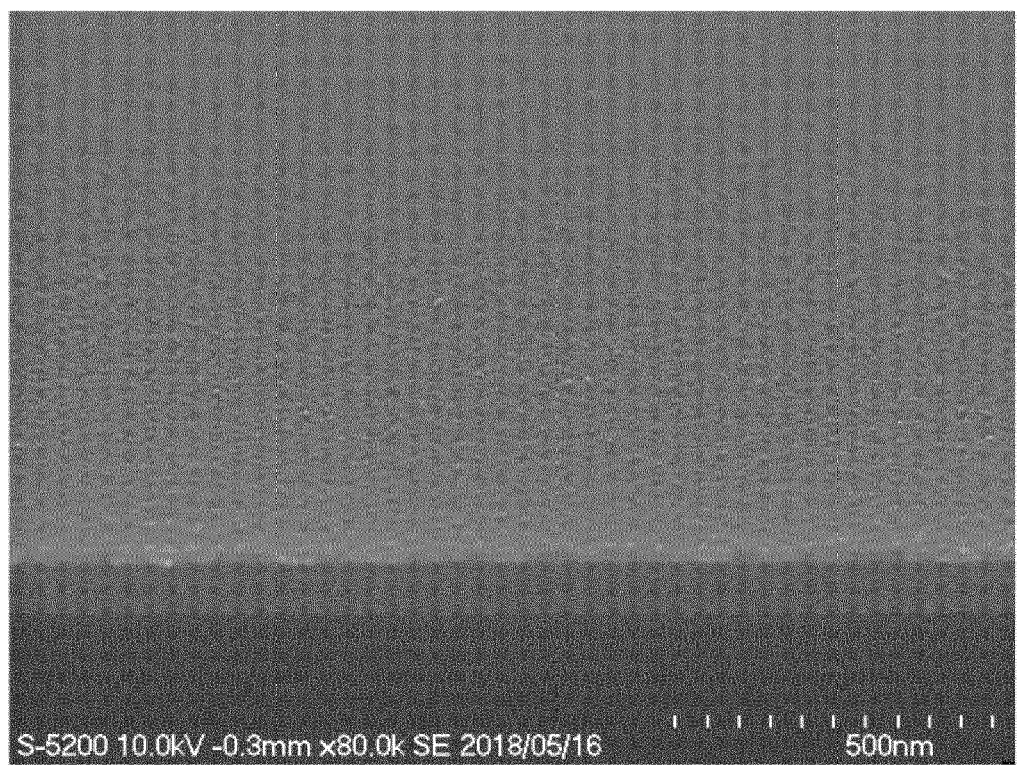
FIG. 20 is a SEM analysis result of a Ge-containing Co film in Example 26.

A Ge-containing Co film was formed on a substrate by a thermal CVD method using Et$_2$Ge—(Co(CO)$_4$)$_2$ as a Ge-containing Co-film forming material, without using an additive gas, under the following conditions. The results of XPS analysis of the film thus obtained are shown in FIG. 18 and the analysis results obtained by SEM are shown in FIGS. 19 and 20.

Film Formation Conditions

Device used: An apparatus having the configuration shown in FIG. 2 was used. A shower head for supplying the Ge-containing Co-film forming material and the carrier gas introduced into the chamber 102 shown in FIG. 2 to the substrate 103 held in the substrate holder in the chamber 102 was attached to the chamber (102), The film formation temperature was controlled by controlling the temperature of the substrate holder.

Ge-containing Co-film forming material: Et$_2$Ge—(Co(CO)$_4$)$_2$

Substrate: SiO$_2$ (cleaned with HF)

Film formation temperature: 160° C.

Pressure in the chamber: 1 Torr

Ge-containing Co-film forming material container temperature: 63° C.

Carrier gas: argon gas

Carrier gas flow rate: 10 SCCM

Film formation time: 60 min

XPS: K-Alpha manufactured by Thermo Fisher Scientific K. K.

SEM: S-5200 manufactured by Hitachi, Ltd.

Resistance meter: Source Meter 4ZA4, manufactured by Keithley Instruments

AFM: MFP-3D manufactured by Asylum Research Corporation

FIG. 18 shows the XPS analysis results on the Ge-containing Co film obtained above. As shown in FIG. 18, according to the XPS analysis results, Co atoms are detected at a presence ratio of about 45% and Ge atoms are detected at a presence ratio of about 55% in the bulk of the obtained Ge-containing Co film, and it is clear that a Ge-rich CoGe film which is a Ge-containing Co film is formed. The carbon content in the bulk of the obtained Ge-containing Co film of $Et_2Ge—(Co(CO)_4)_2$ was less than 1%, and it can be said that a Ge-containing Co film including few carbon impurities was obtained.

FIG. 19 shows the SEM analysis results on the Ge-containing Co film obtained as described above. As shown in FIG. 19, the average film thickness of the obtained Ge-containing Co film was about 17.4 nm. Since the film formation time was 60 min, the film formation rate was 0.29 nm/min. The bulk resistance value of the obtained Ge-containing Co film was 232.5 µΩ·cm.

FIG. 20 shows the SEM analysis results (enlarged view) on the Ge-containing Co film obtained as described above. As shown in FIG. 20, the obtained Ge-containing Co film was a uniform and conformal film.

Example 27: Thermal CVD of $Et_2Ge—(Co(CO)_4)_2$

A Ge-containing Co film was formed on a substrate by a thermal CVD method using $Et_2Ge—(Co(CO)_4)_2$ as a Ge-containing Co-film forming material, without using an additive gas, under the following conditions. Experimental conditions were the same as in Example 26 except that the film formation temperature was set to 200° C. The results of XPS analysis of the film thus obtained are shown in FIG. 21 and the analysis results obtained by SEM are shown in FIGS. 22 and 23.

Figure 21:
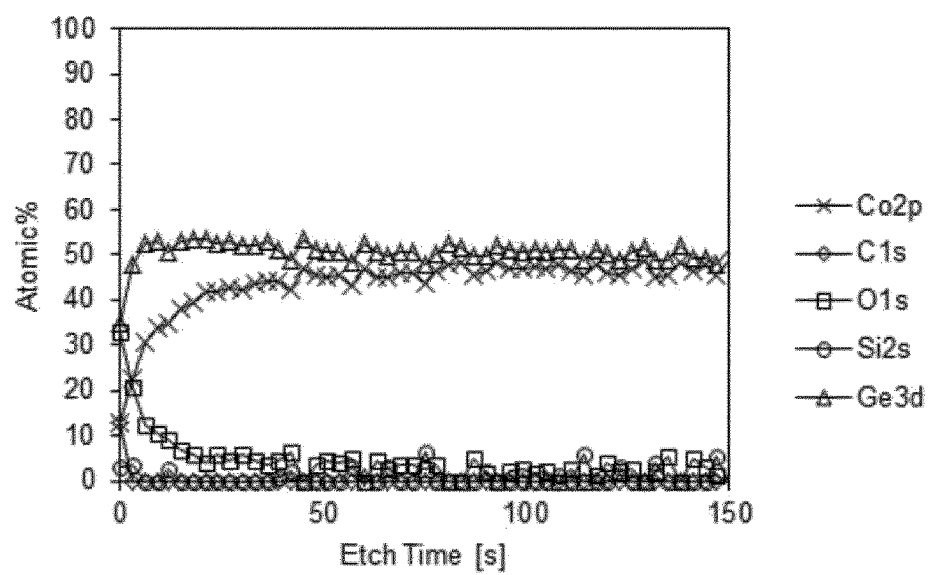
FIG. 21 is an XPS analysis result of a Ge-containing Co film in Example 27.

FIG. 21 shows the XPS analysis results on the Ge-containing Co film obtained above. As shown in FIG. 21, according to the XPS analysis results, Co atoms are detected at a presence ratio of about 50% and Ge atoms are detected at a presence ratio of about 50% in the bulk of the obtained Ge-containing Co film, and it is clear that a Ge-containing Co film is formed. The carbon content in the bulk of the obtained Ge-containing Co film of $Et_2Ge—(Co(CO)_4)_2$ was less than 1%, and it can be said that a Ge-containing Co film including few carbon impurities was obtained.

Figure 22:
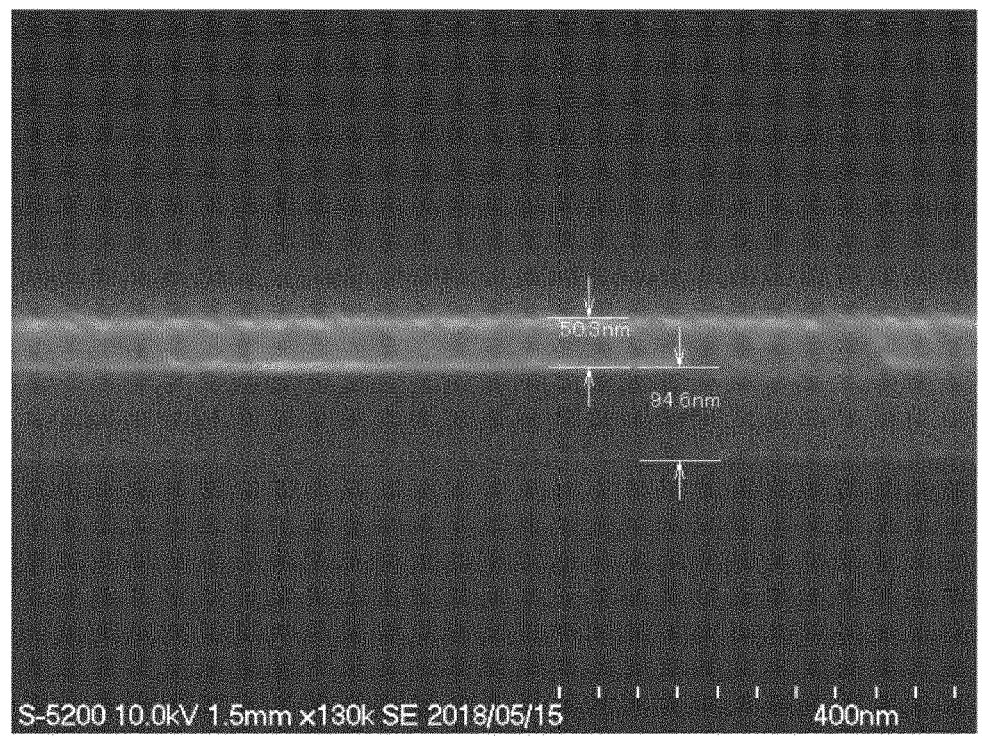
FIG. 22 is a SEM analysis result of a Ge-containing Co film in Example 27.

FIG. 22 shows the SEM analysis results on the Ge-containing Co film obtained as described above. As shown in FIG. 22, the average film thickness of the obtained Ge-containing Co film was about 50.3 nm. Since the film formation time was 60 min, the film formation rate was 0.84 nm/min. The bulk resistance value of the obtained Ge-containing Co film was 243.58 µΩ·cm.

Figure 23:
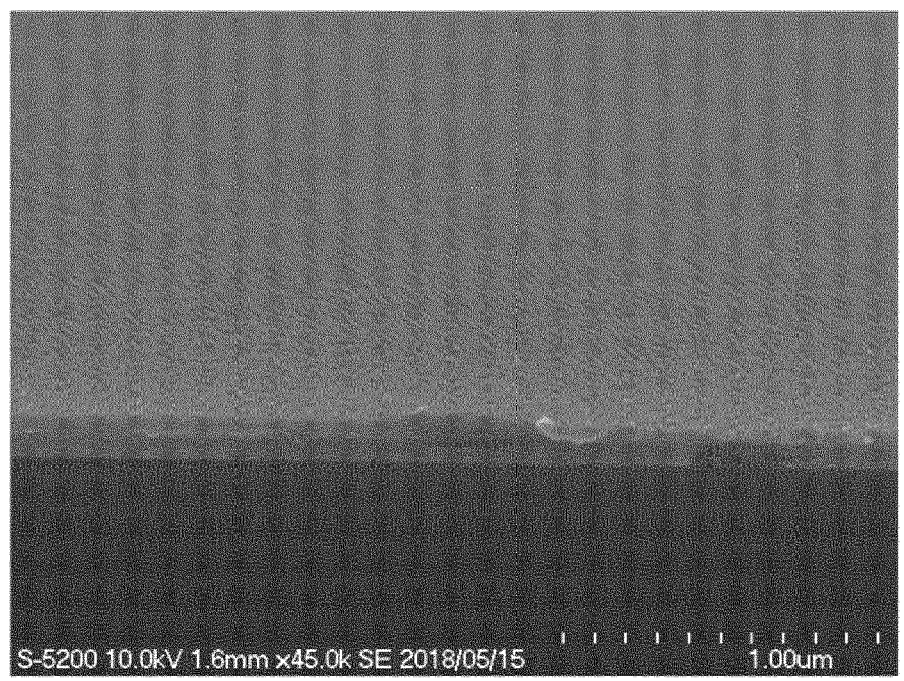
FIG. 23 is a SEM analysis result of a Ge-containing Co film in Example 27.

FIG. 23 shows the SEM analysis results (enlarged view) on the Ge-containing Co film obtained as described above. As shown in FIG. 23, the obtained Ge-containing Co film was a uniform and conformal film.

Example 28: Thermal CVD of $Et_2Ge—(Co(CO)_4)_2$

A Ge-containing Co film was formed on a substrate by a thermal CVD method using $Et_2Ge—(Co(CO)_4)_2$ as a Ge-containing Co-film forming material, without using an additive gas, under the following conditions. Experimental conditions were the same as in Example 26 except that the film formation temperature was set to 220° C. The results of XPS analysis of the film thus obtained are shown in FIG. 24 and the analysis results obtained by SEM are shown in FIGS. 25 and 26.

Figure 24:
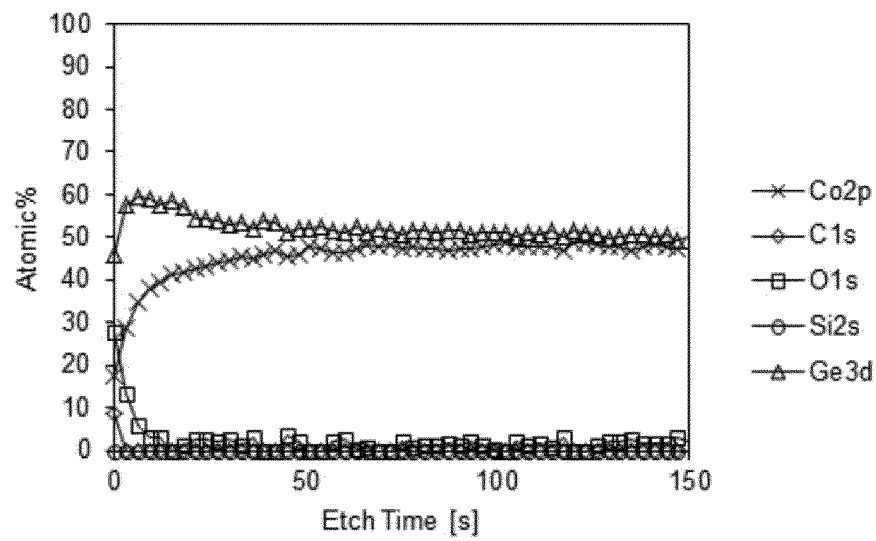
FIG. 24 is an XPS analysis result of a Ge-containing Co film in Example 28.

FIG. 24 shows the XPS analysis results on the Ge-containing Co film obtained above. As shown in FIG. 24, according to the XPS analysis results, Co atoms are detected at a presence ratio of about 50% and Ge atoms are detected at a presence ratio of about 50% in the bulk of the obtained Ge-containing Co film, and it is clear that a Ge-containing Co film is formed. The carbon content in the bulk of the obtained Ge-containing Co film of $Et_2Ge—(Co(CO)_4)_2$ was less than 1%, and it can be said that a Ge-containing Co film including few carbon impurities was obtained.

Figure 25:
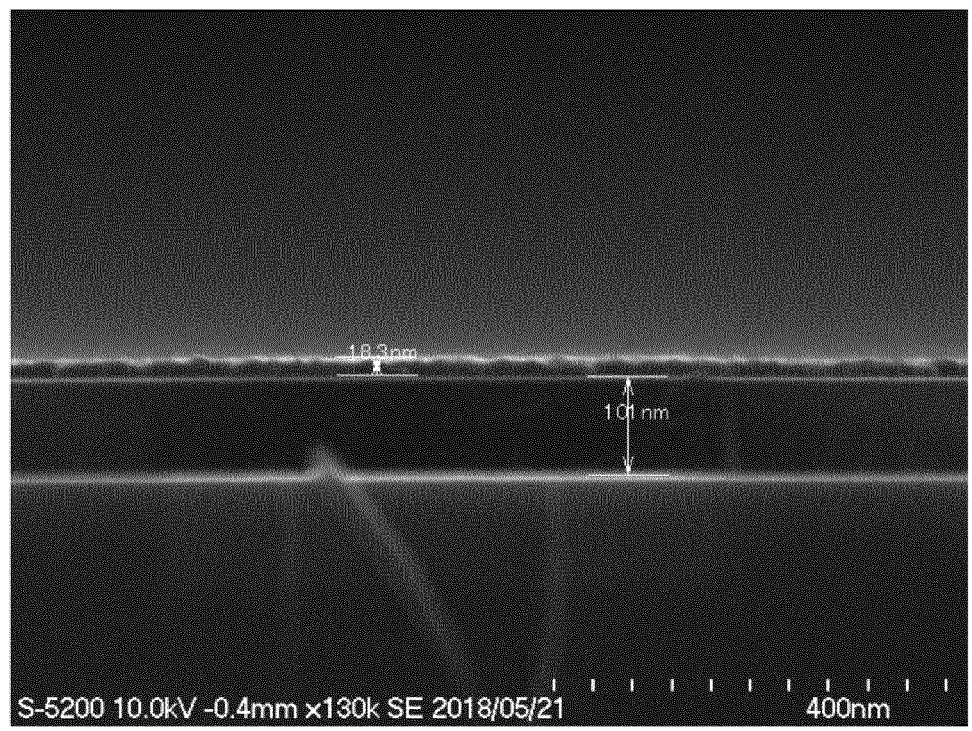
FIG. 25 is a SEM analysis result of a Ge-containing Co film in Example 28.

FIG. 25 shows the SEM analysis results on the Ge-containing Co film obtained as described above. As shown in FIG. 25, the average film thickness of the obtained Ge-containing Co film was about 18.3 nm. Since the film formation time was 60 min, the film formation rate was 0.31 nm/min. The bulk resistance value of the obtained Ge-containing Co film was 141.8 µΩ·cm.

Figure 26:
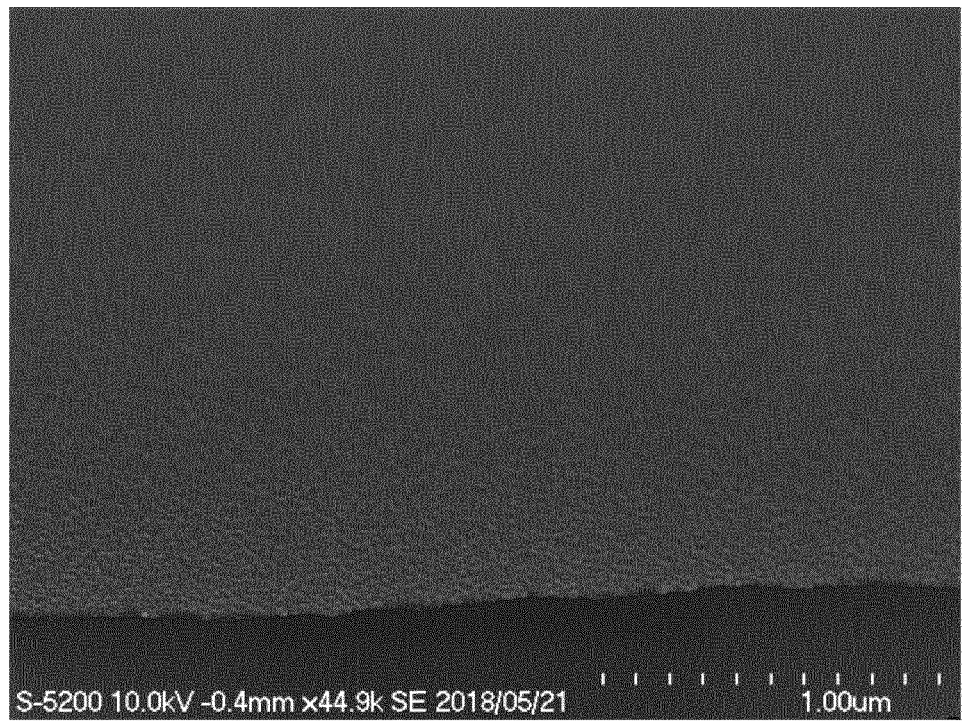
FIG. 26 is a SEM analysis result of a Ge-containing Co film in Example 28.

FIG. 26 shows the SEM analysis results (enlarged view) on the Ge-containing Co film obtained as described above. As shown in FIG. 26, the obtained Ge-containing Co film was a uniform and conformal film.

As shown in Examples 26, 27 and 28 hereinabove, it was possible to form Ge-containing Co films using $Et_3Ge—(Co(CO)_4)_2$ as a film forming material.

The content of Ge atoms and Co atoms in the formed Ge-containing Co films was in the range of 40% to 60%.

The present invention is not limited to the above-described embodiments, and various modifications are possible. For example, the present invention is inclusive of a configuration which is substantially the same as the configuration described in the embodiment (for example, a configuration having the same function, a method, and a result, or a configuration having the same purpose and effect).

Further, the present invention is inclusive of a configuration in which non-essential parts of the configuration described in the embodiment are replaced. Furthermore, the present invention is inclusive of a configuration that can demonstrate the same operational effect or achieve the same object as the configuration described in the embodiment. The present invention is also inclusive of a configuration in which a publicly-known technique is added to the configuration described in the embodiment.

REFERENCE SIGNS LIST

10 Substrate
12 Recessed portion
20 Ge-containing Co film
101 CVD device
102 Chamber
103 Substrate
201 Ge-containing Co-film forming material supply pipe
202 Additive gas supply pipe
204 Ge-containing Co-film forming material flow rate adjusting mechanism
205 Additive gas flow rate adjusting mechanism
301, 302 Additive gas containers
304 Ge-containing Co-film forming material container
401 Carrier gas supply pipe
405 APC valve

The invention claimed is:

1. A Ge-containing Co-film forming material for forming a Ge-containing Co film for manufacturing a semiconductor device,
the material being a compound represented by general formula (1) below or general formula (2) below

wherein $R^1$, $R^2$ and $R^3$ are each independently hydrogen, a nonaromatic hydrocarbon group, a halogeno group or a halogenated nonaromatic hydrocarbon group;
however, the nonaromatic hydrocarbon group excludes a crosslinked nonaromatic hydrocarbon group, and the halogenated nonaromatic hydrocarbon group excludes a crosslinked halogenated nonaromatic hydrocarbon group;

wherein $R^4$ and $R^5$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group.

2. The Ge-containing Co-film forming material according to claim 1, wherein the compound represented by the general formula (1) or the general formula (2) further comprises one or two neutral adduct ligands selected from a group consisting of $NMe_3$, $NEt_3$, $NiPr_3$, $NMeEt_2$, $NC_5H_5$, $OC_4H_8$, $Me_2O$, $Et_2O$, $Et_2S$, $^nPr_2S$, and $^nBU_2S$.

3. The Ge-containing Co-film forming material according to claim 1,
wherein the material is a compound represented by the general formula (1); and
wherein $R^1$, $R^2$ and $R^3$ are each independently a hydrocarbon group or a halogenated hydrocarbon group with a carbon number from 1 to 4.

4. The Ge-containing Co-film forming material according to claim 3, wherein the compound represented by the general formula (1) is $Et_3Ge—Co(CO)_4$.

5. The Ge-containing Co-film forming material according to claim 1,
wherein the material is a compound represented by the general formula (2); and
wherein $R^4$ and $R^5$ each independently represent a hydrocarbon group or a halogenated hydrocarbon group with a carbon number from 1 to 4.

6. The Ge-containing Co-film forming material according to claim 5, wherein the compound represented by the general formula (2) is $Co(CO)_4Et_2Ge—Co(CO)_4$.

7. A Ge-containing Co film formed by depositing the Ge-containing Co-film forming material according to claim 1 by a CVD method or an ALD method.

8. The Ge-containing Co film according to claim 7, wherein a composition ratio Ge:Co ranges from 1:99 to 99:1.

9. The Ge-containing Co film according to claim 7, wherein the thickness of the Ge-containing Co film ranges from 0.1 nm to 400 nm.

10. The Ge-containing Co film according to claim 7 having a bulk resistance value ranging from 6 μΩ·cm to 300 μΩ·cm.

11. The Ge-containing Co film according to claim 7 having a surface roughness (RMS) ranging from 0.1 nm to 15 nm.

12. The Ge-containing Co film according to claim 7, wherein when the film is formed on a substrate having at least one recessed portion, a ratio of the film thickness on an inner wall surface or an inner bottom surface of the recessed portion to the film thickness on the surface of the substrate is in the range of 0.2 to 1.1.

13. The Ge-containing Co film according to claim 7, having a minimum continuous film thickness ranging from 1 nm to 5 nm.

14. The Ge-containing Co film according to claim 7, wherein the film is a low-resistance contact layer formed on a source/drain region of a FinFET transistor arranged on a Si or Ge substrate.

15. The Ge-containing Co film according to claim 7, wherein the film is a barrier layer of a wiring layer.

16. An electronic device comprising the semiconductor device according to claim 15.

17. A semiconductor device comprising the Ge-containing Co film according to claim 7.

18. A method for forming a Ge-containing Co film, the method comprising:
a first step of introducing a substrate into a chamber;
a second step of introducing a Ge-containing Co-film forming material represented by general formula (1) below or general formula (2) below into the chamber in which the substrate has been disposed, while controlling an introduction amount of the Ge-containing Co-film forming material; and
a third step of depositing at least a part of the Ge-containing Co-film forming material on the substrate so as to form the Ge-containing Co film

wherein $R^1$, $R^2$ and $R^3$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group;

wherein $R^5$ and $R^6$ are each independently hydrogen, a nonaromatic hydrocarbon group, a halogeno group or a halogenated nonaromatic hydrocarbon group; however, the nonaromatic hydrocarbon group excludes a crosslinked nonaromatic hydrocarbon group, and the halogenated nonaromatic hydrocarbon group excludes a crosslinked halogenated nonaromatic hydrocarbon group.

19. The method for forming a Ge-containing Co film according to claim 18, wherein the third step is selected from a group consisting of chemical vapor deposition (CVD), atomic layer deposition (ALD), plasma enhanced chemical vapor deposition (PECVD), plasma enhanced atomic layer deposition (PEALD), pulsed chemical vapor deposition (PCVD), low-pressure chemical vapor deposition LPCVD), reduced pressure chemical vapor deposition (SACVD), atmospheric pressure chemical vapor deposition (APCVD), spatial ALD, radical assisted deposition, supercritical fluid deposition, and combinations thereof.

20. The method for forming a Ge-containing Co film according to claim 19, further comprising:
a fourth step of introducing at least one additive gas selected from a group consisting of ammonia, hydrogen, an inactive gas, an alcohol, an amino alcohol, an amine, $GeH_4$, $Ge_2H_6$, and combinations thereof into the chamber.

21. The method for forming a Ge-containing Co film according to claim 18, wherein the third step is carried out at a temperature in the range of 0° C. to 350° C.

22. The method for forming a Ge-containing Co film according to claim 18, wherein the pressure in the chamber ranges from 0.06 Torr to atmospheric pressure.

\* \* \* \* \*